(12) United States Patent
Coene et al.

(10) Patent No.: US 7,791,507 B2
(45) Date of Patent: Sep. 7, 2010

(54) CODER AND A METHOD OF CODING FOR CODES WITH A PARITY-COMPLEMENTARY WORD ASSIGNMENT HAVING A CONSTRAINT OF D=1, R=2

(75) Inventors: Willem Marie Julia Marcel Coene, Eindhoven (NL); Andries Pieter Hekstra, Eindhoven (NL); Hiroyuki Yamagishi, Tokyo (JP); Makoto Noda, Tokyo (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/097,570

(22) PCT Filed: Dec. 8, 2006

(86) PCT No.: PCT/IB2006/054698

§ 371 (c)(1),
(2), (4) Date: Jun. 16, 2008

(87) PCT Pub. No.: WO2007/072277

PCT Pub. Date: Jun. 28, 2007

(65) Prior Publication Data

US 2009/0015446 A1    Jan. 15, 2009

(30) Foreign Application Priority Data

Dec. 19, 2005    (EP) .................................. 05112374

(51) Int. Cl.
H03M 7/00    (2006.01)

(52) U.S. Cl. .......................................... 341/59; 341/50

(58) Field of Classification Search .................... 341/50, 341/67, 65, 51, 508
See application file for complete search history.

(56) References Cited

U.S. PATENT DOCUMENTS

| 5,472,222 | A | * | 12/1995 | Marcy | ........................ 280/433 |
| 5,477,222 | A | | 12/1995 | Kahlman et al. | |
| 5,696,505 | A | * | 12/1997 | Schouhamer Immink | .... 341/59 |

(Continued)

FOREIGN PATENT DOCUMENTS

WO    0241500 A1    5/2002

OTHER PUBLICATIONS

J. Moon et al, "Maximum Transition Run Codes for Data Storage Systems", IEEE Transactions on Magnetics, vol. 32, No. 5, pp. 3992-3994.

(Continued)

*Primary Examiner*—Peguy JeanPierre

(57) ABSTRACT

A coder converts M-bit information words into N-bit code words by generating a first and a second provisional code sequence using a coding rule by which, code words are logically assigned to information words so that a two's complement of a sum of coding bits included in the first provisional code sequence, is always different from a two's complement of a sum of coding bib included in the second provisional code sequence, when a first code state of the first sequence encoded starting from a predetermined original state is identical to a second code state of the second sequence encoded starting from said predetermined original state. Then, selecting either the first sequence or the second sequence depending on a value of at least one parameter that correlates with a DC content of the coded bit stream.

40 Claims, 3 Drawing Sheets

U.S. PATENT DOCUMENTS

| | | | | |
|---|---|---|---|---|
| 5,943,368 | A * | 8/1999 | Bergmans et al. | 375/295 |
| 6,496,541 | B1 * | 12/2002 | Kahlman et al. | 375/253 |
| 6,891,483 | B2 * | 5/2005 | Noda et al. | 341/58 |
| 7,119,721 | B2 * | 10/2006 | Coene | 341/59 |
| 7,263,052 | B2 * | 8/2007 | Coene et al. | 369/59.25 |
| 7,403,138 | B2 * | 7/2008 | Coene | 341/58 |
| 2001/0040518 | A1 * | 11/2001 | Coene | 341/59 |
| 2003/0028839 | A1 * | 2/2003 | Coene et al. | 714/758 |
| 2008/0141095 | A1 * | 6/2008 | Cai et al. | 714/755 |

OTHER PUBLICATIONS

T. Nishiya et al, "Turbo-EEPRML: An EEPRML Channel With an Error Correcting Post-Processor Designed for 16/17 Rate Quasi MTR Code", Proceedings GLOBECOM '98, Sydney, pp. 2706-2711, 1998.

K.A.S. Immink et al, "Eefficient DC-Free RLL Codes for Optical Recording", IEEE Transactions on Communications, vol. 51, No. 3, pp. 326-331, Mar. 2003.

J.J. Ashley et al, "Time-Varying Encoders for Constrained Systems: An Approach to Limiting Error Propagation", IEEE Transactions on Information Theory, vol. 46, No. 3, pp. 1038-1043.

R.L. Adler, et al, "Algorithms for Sliding Block Codes. An Application of Symbolic Dynamics to Information Theory", IEEE Transaction on Information Theory, Vol. IT-29, 19893 pp. 5-22.

E. Yamada et al, "Turbo Decoding With Run Length Limitted Code for Optical Storage", Japanese Journal of Applied Physics, Part-1, vol. 41, pp. 1753-1756, 2002.

T. Miyauchi et all, "Soft-Output Decoding of 17 Parity Preserve/ Prohibit Repeated Minimum Transition Runlength (PP) Code", Japanese Journal of Applied Physics, vol. 43, No. 7B, Jul. 29, 2004, pp. 4882-4883.

T. Miyauchi et al, "Application of Turbo Codes to High-Density Optical Disc Storage Using 17PP Code", Japanese Journal of Applied Physics, vol. 44, No. 5B, pp. 3471-3473.

W.G. Bliss, Circuitry for Performing Error Correction Calculations on Baseband Encoded Data to Eliminate Error Propagation, IBM Technical Disclosure Bulletin, vol. 23, pp. 4633-4634.

WIM Coene et al, "Run-Length Limited Parity-Check for Transition-Shift Errors in Optical Recording", IEEE Global Telecommunications Conference, San Antonio, TX, Nov. 25-29, 2001, pp. 2982-2986.

Zining Wu, "Coding and Iterative Detection for Magnetic Recoding Channels", Kluwer Academic Publishers, 2000, p. 21-101.

Kinji Kayanuma et al, "Eight to Twelve Modulation Code for High Density Optical Disk", Technical Digest ISOM-2003, Nov. 3-7, 2003, Nara, Japan Paper WE-F-45, pp. 160-161.

Toshiyuki Miyauchi et al, "Soft-Output Decoding of 17 PP Code", Technical Digest ISOM 2003, International Symposium on Optical Memory, Nara, Japan, Paper WE-PP-13, pp. 314-315.

* cited by examiner $U_0 = \overline{C_0 C_2 C_3 C_4} + C_2 C_4 + C_3 \overline{C_6 C_7} + C_0 C_2 + \overline{C_0 C_2} C_5 + C_3 C_8 C_{10}$ $U_1 = C_6 \overline{C_9 C_{10}} + \overline{C_3 C_5} + C_6 \overline{C_{11} C_{13}} + C_3 \overline{C_6 C_8} + \overline{C_1} C_3 \overline{C_7} + C_3 \overline{C_5} C_7$

CODER AND A METHOD OF CODING FOR CODES WITH A PARITY-COMPLEMENTARY WORD ASSIGNMENT HAVING A CONSTRAINT OF D=1, R=2

INTRODUCTION

This invention relates to a method of converting a user bitstream into a coded bitstream by means of a channel code, to a recording device using said method of converting a user bitstream into a coded bitstream by means of a channel code and a playback device for decoding a user bit stream coded using the method of converting a user bitstream into a coded bitstream by means of a channel code.

BACKGROUND ART

In the literature of run length limited coding, the Repeated Minimum Transition Run, i.e. RMTR, constraint is often referred to as the MTR constraint. Originally, the maximum transition-run (MTR) constraint as introduced by J. Moon and B. Brickner, in "Maximum transition run codes for data storage systems", IEEE Transactions on Magnetics, Vol. 32, No. 5, pp. 3992-3994, 1996, (for a d=0 case) specifies the maximum number of consecutive "1"-bits in the NRZ bitstream (where a "1" indicates a transition in the related bi-polar channel bitstream). Equivalently, in the (bi-polar) NRZI bitstream, the MTR constraint limits the number of successive 1T runs. The MTR constraint can also be combined with a d-constraint, in which case the MTR constraint limits the number of consecutive minimum runlengths, as is the case for the 17PP code which is used in the Blu-Ray disc (BD) format (EP1000467). The basic idea behind the use of MTR codes is to eliminate the so-called dominant error patterns, that is, those patterns that would cause most of the errors in the partial response maximum likelihood (PRML) sequence detectors used for high density recording. A highly efficient rate 16→17 MTR code limiting the number of consecutive transitions to at most two for d=0 has been described by T. Nishiya, K. Tsukano, T. Hirai, T. Nara, S. Mita, in "Turbo-EEPRML: An EEPRML channel with an error correcting post-processor designed for 16/17 rate quasi MTR code", Proceedings Globecom '98, Sydney, pp. 2706-2711, 1998. Another argument in favor of the RMTR constraint is to limit the back-tracking depth (or trace-back depth) of the Viterbi (PRML) bit-detector. The disclosure of U.S. Pat. No. 5,943, 368 aims to encode data into a channel bitstream that prohibits the generation of single-frequency components (which can be a long repetition of (minimum) runlengths).

The RMTR constraint has recently regained some interest in the optical recording community. The ETM-code disclosed in K. Kayanuma, C. Noda and T. Iwanaga, "Eight to Twelve Modulation Code for High Density Optical Disk", Technical Digest ISOM-2003, Nov. 3-7 2003, Nara, Japan, paper We-F-45, pp. 160-161 has d=1, k=10 and r=5 constraints, this r constraint being just one lower than the RMTR of 17PP which has r=6. For d=1 and RMTR r=2, the theoretical Shannon capacity amounts to:

$$C(d=1,k=\infty,r=2)=0.679286. \quad (1)$$

So, a code with rate better than 2/3 is still feasible. For an even more aggressive RMTR constraint r=1, the theoretical Shannon capacity amounts to:

$$C(d=1,k=\infty,r=1)=0.650900. \quad (2)$$

This shows that r=2 is the lowest RMTR constraint that is possible for a code rate not lower than that of the 17PP code.

Recently, in K. A. S. Schouhamer Immink, "Method and Apparatus for Coding Information, Method and Apparatus for Decoding Coded Information, Method of Fabricating a Recording Medium, the Recording Medium and Modulated Signal", PCT Patent WO 02/41500 A1, International Filing Date 11 Nov. 2000, and in K. A. S. Immink, J.-Y. Kim, S.-W. Suh, S. K. Ahn, "Efficient dc-Free RLL Codes for Optical Recording", IEEE Transactions on Communications, Vol. 51, No. 3, pp. 326-331, March 2003, some very efficient d=1 codes were disclosed with a code-rate that is very close to the Shannon capacity for d=1, given by C(d=1, k=0, r=0) 0.6942. As an example, a code with a rate of R=9/13 has been realized, which has a code efficiency $$\eta = \frac{R}{C}$$

such that 1−η=0.28%. However, these very efficient RLL codes suffer from the absence of an RMTR constraint (r=∞); therefore, the latter 9-to-13 d=1 code cannot yield the practical capacity benefit (of typically 5%) through adapted PRML sequence detection that is offered by d=1 codes with r=2.

The performance gain due to the RMTR constraint has been studied experimentally for high-density optical recording channels derived from the Blu-ray Disc (BD) system. Experiments have been performed using the increased-density BD rewritable system with the disc capacity increased from the standard 23.3-25-27 GB to 35 GB. PRML (Viterbi) bit detection has been employed.

Performance of the Viterbi bit detector has been measured based on the sequenced amplitude margin (SAM) analysis. In the relevant range of capacities around 35 GB, 1 dB gain in SAMSNR means almost 6% disc capacity increase.

Channel codes with different RMTR constraints have been compared to each other. In order to separate read-channel performance gain due to the imposed RMTR constraint from the corresponding write-channel gain, two different Viterbi bit detectors have been used: one which is aware of the RMTR constraint, and the other which is not. In the second case the performance gain can be attributed solely to the improved spectral content of the data written on the disc (such that it is better matched to the characteristics of the write channel used).

When the 17PP channel code with the RMTR constraint r=6 (as used in the BD system) is employed, SAMSNR of 11.66 dB is achieved for both RMTR-aware and RMTR-unaware bit detectors, i.e. no RMTR-related performance gain is observed in the read channel. When the channel code with r=2 is used, SAMSNR of 12.55 dB and 12.07 dB are achieved for the RMTR-aware and RMTR-unaware bit detectors correspondingly. As one can see, a total RMTR-related SAMSNR increase of about 0.9 dB is gained with respect to the case of r=6, which corresponds with about 5% disc capacity increase.

DISADVANTAGE OF THE PRIOR ART

At very high densities for a d=1 constrained storage system well beyond the GB of Blu-ray Disc (e.g. capacities on a 12 cm disc in the range of 33-37 GB), consecutive 2T runs are the Achilles' heel for the bit-detection. Such sequences of 2T runs bounded by larger runlengths at both sides, are called 2T-trains. Another advantage of an r=2 constrained d=1 code is that the probability for emission of the shortest 2T-runlengths is reduced by approximately 20%. Since at high storage densities the shortest runlengths are significantly more error-prone than the longer runlengths, the r=2 constraint yields a substantial performance benefit.

Currently, the 17PP code of Blue-Disk has a so-called RMTR constraint (Repeated Maximum Transition Runlength) of r=6, which means that the number of consecutive minimum runlengths is limited to 6 or, equivalently, the maximum length of the 2T-train is 12 channel bits. The 17PP code is based on the parity-preserve principle for DC-control.

It is a disadvantage of the presently known codes that these long trains consisting of consecutive 2T runs together with an overall high frequency of occurrence of the shortest runlengths reduce the performance of the bit detector. Guided scrambling (GS) or the parity-preserve (PP) principle can be used for the purpose of DC-control. For soft-decodable codes with a compact mapping, it can be shown that a parity-preserving code suffers from increased error propagation since the decoder window for sliding block decoding was significantly increased. It is the aim of the current invention to solve this issue, and thus propose measures for a new code with r=2 MTR constraint, being soft-decodable through a compact mapping, and being DC-controllable, and having reduced error-propagation.

An interesting solution for high rate codes is proposed in J. J. Ashley and B. H. Marcus, "Time-Varying Encoders for Constrained Systems: an Approach to Limiting Error Propagation", IEEE Transactions on Information Theory, Vol. 46, No. 3, pp. 1038-1043, May 2000. The latter approach generalizes the well known state-splitting algorithm or ACH-algorithm as disclosed by R. L. Adler, D. Coppersmith, and M. Hassner, "Algorithms for Sliding Block Codes. An Application of Symbolic Dynamics to Information Theory", IEEE Transaction on Information Theory, Vol. IT-29, 1983, pp. 5-22, used for the construction of efficient sliding block codes, for a concatenation of a number of codes at multiple phases, where the encoding and decoding proceeds cyclically from one phase to the next. Practically, for the new code with rate R=27/40, the overall code can be realized as a cyclic concatenation of three sub-codes, denoted $C_1$, $C_2$ and $C_3$, with respective mappings 9-to-13, 9-to-13 and 9-to-14.

OBJECTIVE OF THE INVENTION

It is therefore the objective of the present invention to provide a code with particularly chosen constraints that improves the performance of the bit-detector, together with the property that the code is soft-decodable with low hardware-complexity due to its compact mapping, and together with the property that the code is DC-controllable, and together with the property that the error-propagation of the code is reduced.

Solution

This objective is achieved by the present invention by performing the following steps:
  M-bit information words are converted into N-bit code words,
  said overall channel code being realized through the concatenation of a number S of sub-codes in a cyclically repeated order with a predetermined repeat period, wherein each of the sub-codes receives $m_i$-bit information words, where $m_i$ is an integer characteristic for each of the sub-codes, that are converted into $n_i$-bit code words, where $n_i$ is an integer characteristic for each of the sub-codes, and where for each sub-code, said characteristic integer number $n_i$ is greater than said characteristic integer number $m_i$ such that the sum of the $m_i$-numbers of all sub-codes within said repeat period equals M, and that the sum of the $n_i$-numbers of all sub-codes within said repeat period equals N, and:
  for each sub-code, its $n_i$-bit code words are being divided into a number of $T_{max}$ different code-word types and are being arranged into $T_{max}$ coding classes of coding states such that, for a given sub-code, an $n_i$-bit code word of type t (where t is an integer number between 1 and $T_{max}$) can be concatenated with an $n_{i+1}$-bit code word of the next sub-code if said subsequent code word of said next sub-code belongs to one of coding states of the coding class with index $T_{max}+1-t$ and:
  generating an output information sequence comprising:
    generating a first output information sequence by inserting a first DC control bit into an input information sequence at predetermined intervals,
    generating a second output information sequence by inserting a second DC control bit different from the first DC control bit into the input information sequence at said predetermined intervals, the step of generating an output information sequence being followed by:
  a first code converting step realized by said overall channel code, comprising:
    generating a first provisional code sequence by performing a code conversion of said first output information sequence generated by the information sequence generating means according to said overall code,
    generating a second provisional code sequence by performing a code conversion of said second output information sequence generated by the information sequence generating means according to said overall code,
  characterized in that the step of generating a first provisional code sequence and the step of generating a second provisional code sequence apply a coding rule by which, when representing the coding rule by a finite-state code conversion table, code words are assigned to information words so that a two's complement of a sum of coding bits included in the first provisional code sequence, (also known as the parity of said first provisional code sequence), is always different from a two's complement of a sum of coding bits included in the second provisional code sequence, (also known as the parity of said second provisional code sequence), when a first code state of the first provisional code sequence encoded starting from a predetermined original state is identical to a second code state of the second provisional code sequence encoded starting from said predetermined original state, and that the step of generating a first provisional code sequence and the step of generating a second provisional code sequence are followed by:
    selecting either the first provisional code sequence generated by the first code converting means or the second provisional code sequence generated by the second code converting means depending on a value of at least one parameter that correlates with a DC content of the coded bit stream.

By applying the parity-complementary word assignment (PCWA) property as disclosed in U.S. Pat. No. 6,891,483 B2 to d=1 r=2 constrained codes high quality DC control is obtained while retaining the enhanced detection provided by the d=1 r=2 codes, while reducing error propagation.

All runlength-limited (RLL) codes used in optical recording are DC-free, that is, they have almost no content at low frequencies. This property is an example of a frequency domain constraint. Here, restrictions are enforced on the energy content per time unit of the sequence at certain frequencies, that is, on the power spectral density function of the sequence. Most of these constraints belong to the family of spectral null constraints, where the power density function of the sequence must have a zero of a certain order at certain specific frequencies. The constraint that specifies a zero at DC, the zero frequency, is referred to as the DC-free constraint. It is assumed to represent the channel bits $x_i$ produced by the 1T-precoder by the bipolar values ±1. A sequence $x_1$, $x_2$, . . . is called DC-free if its running digital sum (RDS) $RDS_i = x_1 + \ldots + x_i$ takes on only finitely many different values. In that case, the power spectral density function vanishes at DC.

The DC-free property is needed in optical recording for a number of reasons. Firstly, it is necessary to separate the data signal from low-frequency disc noise such as fingerprints, dust or defects. Secondly, DC-free coding is needed for control of the slicer level in the case of non-linearities in the physical signals like pit-land asymmetries. And thirdly, servo systems used for tracking and focusing of the laser spot position typically require a DC-free data signal.

It is appropriate now to discuss a general method to achieve DC-control in RLL sequences. As discussed above, DC-control is performed via control of the running digital sum (RDS). A very useful concept herein is the parity, the number of ones modulo 2, of a sequence of bits. Recall that a "1"-bit in the differential code sequence (or channel bitstream) indicates the start of a new run in the (bipolar) bitstream after the 1T-precoder (the bits that are actually written to the disc). Hence, because of the 1T-precoder between differential and unipolar channel bitstreams, each "1"-bit in the differential bitstream changes the polarity in the corresponding unipolar bitstream (or bipolar bitstream, depending on the notation). Consequently, an odd number of ones in a segment of the differential bitstream reverses the polarity after that segment while an even number of ones leaves the polarity unchanged.

The above observation can be used for DC-control as follows. Suppose that for a certain segment of the differential channel bitstream, a choice exists between two candidate sequences, one with parity "0", the other with parity "1".

Then the part of the bipolar bitstream after this segment will have a contribution to the RDS where the sign but not the magnitude depends on which of the two sequences is chosen. The best choice is of course the one that keeps the value of the RDS as close to zero as possible. For obvious reasons, these segments are referred to as DC-control segments.

In order to realise DC-control, DC-control segments are to be inserted at regular positions in the bitstream. Such positions are referred to as DC-control points. This is the basic mechanism for DC-control in RLL codes.

A very interesting class of procedures for DC-control is the one where additional bits are inserted in the user bitstream prior to RLL encoding. The parity-preserve (PP) principle (Device for encoding/decoding N-bit Source Words into Corresponding M-bit Channel Words, and vice versa, U.S. Pat. No. 5,477,222, J. A. H. Kahlman and K. A. S. Immink, 1995) is such a type of RLL coding for DC-control. A generalization of the PP principle is introduced in Encoding Apparatus and Method, Recording Medium and Program by M. Noda and H. Yamagishi, U.S. Pat. No. 6,891,483 B2, May 10, 2005, where the concept of a parity-complementary word assignment is introduced.

Parity-Complementary Word Assignment (PCWA)

The principle of the parity-complementary word assignment (PCWA) is explained as follows using the diagram of FIG. 1. A trellis is shown for a sliding-block decodable code with a finite-state machine (FSM) of 5 states for this particular case of the drawing. With each step in the trellis is associated at the input a user word and a current state in the FSM of the code, and correspondly due to the action of the encoder, an output code word is produced together with a next state in which the FSM resides for the encoding of the next channel word. For instance, for the d=1 r=2 RLL code considered in the current invention, the input word is 2 user bits long, and the code word is 3 channel bits long. In general, input words are m user bits long, and output code words are n channel bits long. DC-control bits are inserted at well-defined locations in the information bitstream or user bitstream. These locations are preferably regularly spaced with a fixed number of user bits in between two consecutive DC-control bits. Depending on the RLL-PCWA code used, the DC-control bit is located at a specified position in the m-bit user word at the location of the DC-control point. For instance, for codes with 2-to-3 mapping, some PCWA-codes have the $1^{st}$ bit of the user di-bit as DC-control bit, while other PCWA-codes have the $2^{nd}$ bit of the user di-bit as DC-control bit. For the sake of simplicity, in the sequel of this description and in the further code design, it is always assumed without loss of generality that the PCWA-codes have the $1^{st}$ bit of the user di-bit as DC-control bit. By insertion of the DC-control bits in the user bitstream, an output information sequence is generated. A first provisional code sequence is generated by a first code converting means with the DC-control bit set equal to a predetermined value, say 0. Similarly, by means of a second code converting means, a second provisional code sequence is generated with the DC-control bit set to the alternative value, say 1 in the above practical case. The $1^{st}$ provisional code sequence will follow a well-defined coding path in the trellis, starting from the original state from which the information word that carries the DC-control bit is to be encoded. Analoguously, the $2^{nd}$ provisional code sequence will follow another well-defined path in the trellis, starting from the same original state as just defined above. Both encoder paths for the $1^{st}$ and $2^{nd}$ provisional code sequences may merge at a certain stage in the trellis, as is shown in FIG. 1 (for this particular example of FIG. 1, merging occurs after 4 stages of the trellis). From the point of merging onwards, both the $1^{st}$ and the $2^{nd}$ provisional code sequences will follow the same encoder path through the trellis, and will consequently have the same channel bit sequence and coding states from that point of merging onwards (in the sequel, the state at the point of merging will be shortly referred to as the merging state). The PCWA-property now implies that, on condition that both encoder paths merge, the parities of both provisional code sequences computed from the original state up to the merging state, and denoted by $p_0$ and $p_1$, have opposite binary values. The parity of a code sequence is the two's complement of the sum of the channel bits as they are produced by the $1^{st}$ and $2^{nd}$ code converting means (thus note that these channel bits are differential channel bits, that are subsequently transformed into unipolar (or bipolar) channel bits representing marks and non-marks on the information carrier by means of a 1T-precoder, which is essentially an integrator modulo-2). Thus, the PCWA-property dictates that, on the condition of merging encoder paths, $p_0 \neq p_1$. Because of the opposite parities of both code sequences, after the action of the 1T-precoder, the subsequent channel bit sequences, after the point of merging of the two encoder paths, will have opposite polarities in the unipolar channel bitstream. It is well known that the latter property can be used to carry out DC-control (as is also outlined above). Finally, the DC-control encoder comprises a selecting means for selecting either the first provisional code sequence generated by the first code converting means or the second provisional code sequence generated by the second code converting means. The selection is based on an evaluation of the running digital sum for both provisional code sequence, like, for instance, the variance of the running digital sum; the code sequence with the lowest variance of the running digital sum is the one to be selected in view of DC-control.

In the code according to the invention the overall code has the property that the respective channel bit sequences that are encoded from the same message-bit sequence (starting from any possible state of the finite-state-machine) for each of the two values of a DC-control bit (that is part of a given user word) have opposite parities for the sequences generated from the starting state up to the state where both encoder paths merge. For the case that the encoder paths do not merge, there is no such constraint.

Using the same d=1 constraint as for 17PP a reduced RMTR constraint of r=2 allows a better performance of the bit detection. The bit-detection performance is improved considerably, which in turn enables a significant capacity increase (about 5%) compared to the 17PP coding which employs r=6.

To construct such a code the code may be divided into a number of sub-codes that together form the overall code. The sub-codes are used in a sequential order and are cyclically repeated. Each sub-code is used to process a received $m_i$-bit information word, converting the $m_i$-bit information word into an $n_i$-bit code word. This ensures the systematic coding of the information words into code words. To ensure that the d constraint together with the r constraint are complied with, the $n_i$-bit code words are being divided into a number of $T_{max}$ different code-word types and are being arranged into $T_{max}$ coding classes of coding states such that, for a given sub-code, an $n_i$-bit code word of type t (where t is an integer number between 1 and $T_{max}$) can be concatenated with an $n_{i+1}$-bit code word of the next sub-code if said subsequent code word of said next sub-code belongs to one of coding states of the coding class with index $T_{max}+1-t$. The code word type thus defines which coding class is used to select a coding state from. By prescribing this selection of coding class, the encoding of the next information word into a code word using the next sub-code will be performed in such a way that the code word, when appended to the current code word will comply with the d constraint together with the r constraint.

In an embodiment of the method the code-word type is determined by a number of trailing bits of said code-word.

The trailing bits of the code word can be used to determine the code word type since the trailing bits of the code word have a substantial impact on the compliance with the d constraint and the r constraint of the concatenation of the code word with those trailing bits and the next code word which is concatenated to the trailing bits of the code word.

In a further embodiment of the method the code-word type is determined by all bits of said code-word, together with a number of bits of at least one preceding code-word.

When the size of the code words is relatively short compared to the number of bits affected by the r constraint a single code word may no longer have sufficient (trailing) bits to uniquely define a code word type. To solve this problem multiple code words may be considered together as an ensemble and the trailing bits of this ensemble then define the code word type of the ensemble for the purpose of determining the coding class to be used for obtaining the next code word.

In a further embodiment of the method the concatenated N-bit code words satisfy a dkr-constraint, where d and k refer to, respectively, the minimum number and the maximum number of zero-bits between two consecutive one-bits in the coded bitstream, and where r indicates the maximum number of consecutive minimum runs of d zero-bits each preceded by a one-bit.

The introduction of the k constraint allows the improved adaptation of the code to the channel, for instance, for the purpose of control loops for the required adaptation in a receiver, like is needed for timing recovery.

In a further embodiment of the method the number of different code-word types T and non-empty coding classes, wherein a non-empty coding class is defined to have at least one coding state, is not larger than $T_{max}=1+(d+1)\times(r+1)$.

In a further embodiment of the method the number of different code-word types and coding classes, denoted T, equals $T_{max}=1+(d+1)\times(r+1)$.

In the case of a code without empty coding classes the equation for the optimum number of coding classes T is $1+(d+1)\times(r+1)$ so that T equals $T_{max}$.

In a further embodiment of the method with constraints d=1 and r=2, $T_{max}$ equals 7.

A code with constraints d=1 and r=2 according to the invention can be realized with a maximum of 7 coding classes, thus limiting the number of coding classes to limit the complexity of encoding and decoding.

In a further embodiment of the method $T=T_{max}=7$ and the number of sub-codes S equals 1.

It has been found that a code can be constructed having 7 coding classes using only one sub-code. This again allows the limitation of the complexity of the encoding and decoding.

In a further embodiment of the method the single sub-code has a mapping with m=2 and n=3.

A mapping with m=2 and n=3 constitutes a substantial reduction in complexity and allows a soft-decision decoding with limited hardware complexity.

In a further embodiment of the method, for each of the sub-codes, each of said $T \leq T$ non-empty coding classes of coding states comprises $p_1$, $p_2$, $p_{max}$ coding states, wherein the trivial empty coding classes are omitted, such that for the numbers representing the non-zero number of states of the non-empty coding classes $p_1 \leq p_2 \leq \ldots \leq p_{max}$ and with $p_{max}$ giving the total number of coding states for said considered sub-code, and each of the $p_i$ coding states of a given considered class "i", is also a coding state of all classes that have an index larger than "i".

In a further embodiment of the method where d=1 and r=2, for each sub-code the trailing bits are specified for the different code word types by the following set of rules, that is, the n-bit code words of the 1st type end with

"00", the n-bit code words of the 2nd type end with

"0010", the n-bit code words of the 3rd type end with

"001010", the n-bit code words of the 4th type end with

"00101010", the n-bit code words of the 5th type end with

"001", the n-bit code words of the 6th type end with

"00101", the n-bit code words of the 7th type end with

"0010101", and wherein the leading bits of the code words belonging to the different coding classes are determined by the following set of rules, that is, the n-bit code words of a coding state of the 1st class start with

"00", the n-bit code words of a coding state of the 2nd class start with

"00" or "0100", the n-bit code words of a coding state of the 3rd class start with "00", "0100" or "010100", the n-bit code words of a coding state of the 4th class start with "00", "0100", "010100" or "01010100", the n-bit code words of a coding state of the 5th class start with "00", "0100", "010100", "01010100" or "100", the n-bit code words of a coding state of the 6th class start with "00", "0100", "010100", "01010100", "100" or "10100", the n-bit code words of a coding state of the 7th class start with "00", "0100", "010100", "01010100", "100", "10100" or "1010100".

A method for converting information words into code words using a code with the constraints d=1 and r=2, having 7 coding classes results in a set of code word types defined by the trailing bits of the code words and a set of coding classes comprising coding states defined by the leading bits of the code words produced by that coding state.

In a further embodiment of the method with the above case of a single sub-code and 2-bit input words, the number of non-trivial coding classes T equals 6, with coding class number 4 being the empty one, yielding $p_4=0$, and where the number of coding states for each of the 6 non-trivial coding classes of coding states amounts to $p_1=2$, $p_2=2$, $p_3=3$, $P_5=4$, $p_6=5$ and $p_7=5$.

This is an implementation of a coding method comprising a coding class that comprises no coding states, i.e. an empty coding class. Choosing this set of coding classes with the indicated number of coding states allows an efficient code with a 2-to-3 mapping to be constructed. The 2-to-3 mapping allows an efficient implementation of a soft decision detection since it reduces the complexity in terms of the number of branches that leaves from each state of the Finite State Machine, which number equals $2^m$.

In a further embodiment of the method a finite k-constraint is realized through an extra coding shell with substitutions on the coded bitstream added to a Finite-State Machine with a basic 2-to-3 mapping of the code.

In a further embodiment of the method such substitutions that comprise an alternative code word sequence replacing an original code word sequence, the substitutions have a parity or two's complement of the sum of coding bits that is identical to a parity or two's complement of the sum of coding bits of the original code word sequence.

In a further embodiment of the method such substitutions that comprise an alternative code word sequence replacing an original code word sequence, the substitutions have a parity or two's complement of the sum of coding bits that is opposite to a parity or two's complement of the sum of coding bits of the original code word sequence.

In a further embodiment of the method a k=10 constraint is realized through the extra coding shell with substitutions on the coded bitstream.

In a further embodiment of the method a single sub-code is used and where a code-table of the single sub-code is given by

|        | S1     | S2     | S3     | S4     | S5     |
|--------|--------|--------|--------|--------|--------|
| 00 (0) | 000 S3 | 001 S1 | 010 S3 | 100 S3 | 100 S1 |
| 01 (1) | 000 S4 | 001 S2 | 010 S4 | 100 S4 | 100 S2 |
| 10 (2) | 000 S1 | 001 S3 | 010 S1 | 010 S5 | 101 S1 |
| 11 (3) | 000 S2 | 000 S5 | 010 S2 | 100 S5 | 101 S2 |

In a further embodiment of the method there are 8 substitutions in the extra coding shell that are given by:

| Departure State | Sequence of User-Symbols | Channel-Bit Sequence without/with Detour | Arrival State |
|---|---|---|---|
| S1 | 10 10 10 (**) | 000 000 000 => 000 101 010 | S1 |
| S1 | 10 10 11 (**) | 000 000 000 => 000 101 010 | S2 |
| S1 | 10 10 00 (**) | 000 000 000 => 000 101 010 | S3 |
| S1 | 10 10 01 (10) | 000 000 000 => 000 101 010 | S4 |
| S5 | 00 10 10 (**) | 100 000 000 => 100 101 010 | S1 |
| S5 | 00 10 11 (**) | 100 000 000 => 100 101 010 | S2 |
| S5 | 00 10 00 (**) | 100 000 000 => 100 101 010 | S3 |
| S5 | 00 10 01 (10) | 100 000 000 => 100 101 010 | S4 |

The coder according to the invention is described in claims 20 through 38.

The invention will now be described based on figures and tables.

COMPLEXITY CONSIDERATIONS FOR SISO-RLL DECODING

Figure 3:
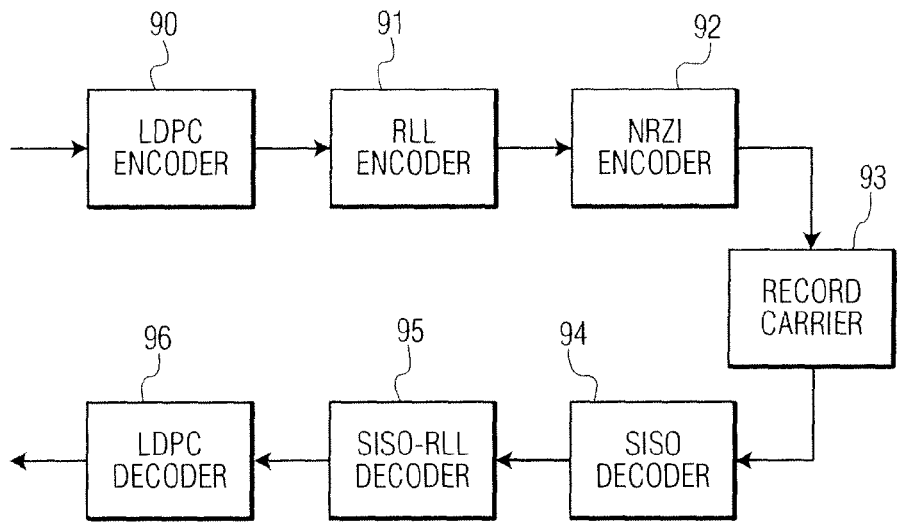
FIG. 3 shows a recording and playback system using Soft-Decision bit detection and Soft-Input-Soft-Output RLL decoder.

The combination of soft-decision (SISO) bit-detection with runlength limited (RLL) coding is disclosed by E. Yamada, T. Iwaki and T. Yamaguchi, in "Turbo Decoding with Run Length Limited Code for Optical Storage", Japanese Journal of Applied Physics, Part-1, Vol. 41, pp. 1753-1756, 2002. First, for the sake of clarity, the so-called direct scheme with the two-stage approach with separate SISO-channel detector and SISO-RLL decoder is considered as shown in FIG. 3. FIG. 3 shows an LDPC encoder 90 that accepts source bits and encodes these source bits into user bits. The user bits are then provided by the LDPC encoder 90 to the RLL encoder 91 that converts the user bits intor NRZ channel bits. These NRZ channel bits are then provided to NRZI encoder 92 (1T precoder) to obtain NRZI channel bits that can be transmitted via a channel or stored on a record carrier 93.

After retrieval from the channel or record carrier 93 the SISO-channel detector processes the HF signal thus retrieved, converts the HF signal into NRZ channel bits and provides the NRZ channel bits to the SISO-RLL decoder 95. The SISO RLL decoder 95 converts the NRZ channel bits into user bits, after which the user bits are processed by the LDPC decoder 96 to obtain the source bits.

The traditional PRML detector is replaced by a SISO-Channel Detector 94, which produces LLRs (log-likelihood-ratios) for the NRZ channel bits. Note that, apart from the BCJR-algorithm, also other algorithms exist for producing the LLR soft-info on the NRZ channel bits: in this sense, the reference made to SISO-Channel Detector 94 in the FIG. 3 should be understood in a broader sense, also representing the alternative algorithms like MAP, Max-log-MAP, SOVA etc. (see e.g. Zining Wu, "Coding and Iterative Detection for Magnetic Recording Channels", Kluwer Academic Publishers, 2000 for more detailed descriptions). The next building block of a soft-decision bit-detector is a so-called soft-in soft-out (SISO) RLL decoder 95: it has as input soft-decision information (LLR) on the NRZ channel bits, and as output, soft-decision information (LLR) on the user bits. Stated differently, the SISO-RLL decoder 95 transforms the soft-decision information that applies to the NRZ channel bitstream $c_k$ towards soft-decision information that applies to the user bitstream $u_k$. Note that a standard RLL decoder has as input the hard bit-decisions on the NRZ channel bits $c_k$, and as output, the as-detected (hard) user-bits $u_k$. Such a SISO-RLL decoder 95 as disclosed by E. Yamada, T. Iwaki and T. Yamaguchi, in "Turbo Decoding with Run Length Limited Code for Optical Storage", Japanese Journal of Applied Physics, Part-1, Vol. 41, pp. 1753-1756, 2002 needs a finite-state machine (FSM) description of the RLL code. A good indication for the hardware complexity of a given RLL-SISO decoder is given by the number of branches in the decoding step.

The 17PP code is not constructed on the basis of the ACH-algorithm; it is a synchronous variable-length code with different mappings, all with code rate $R=\frac{2}{3}$. The practical mappings of the 17PP code are (from user bits to channel bits): 2-to-3, 4-to-6, 6-to-9 and 8-to-12. It has been pointed out by T. Miyauchi and Y. Iida, in "Soft-Output Decoding of 17PP Code", Technical Digest ISOM 2003 (International Symposium on Optical Memory), Nara, Japan, paper We-PP-13, pp. 314-315 that the 17PP RLL code as used in the BD standard, when transformed from a variable-length code structure into a FSM-based code structure (for the purpose of decoding only), has a high state-complexity with 21 states and 79 branches (per stage of the trellis with 2 input bits and 3 channel bits along the branches). Later, the trellis was simplified as 15-state 53-branch. See the technical digest ISOM 2004. T. Miyauchi, Y. Shinohara, Y. Tida, T. Watanabe, Y. Urakawa, H. Yamagishi and M. Noda, "Application of Turbo Codes to High-Density Optical Disc Storage using 17PP code" (Tu-C-03). The RLL codes as derived in the current invention have a substantially lower hardware complexity.

Figure 5:
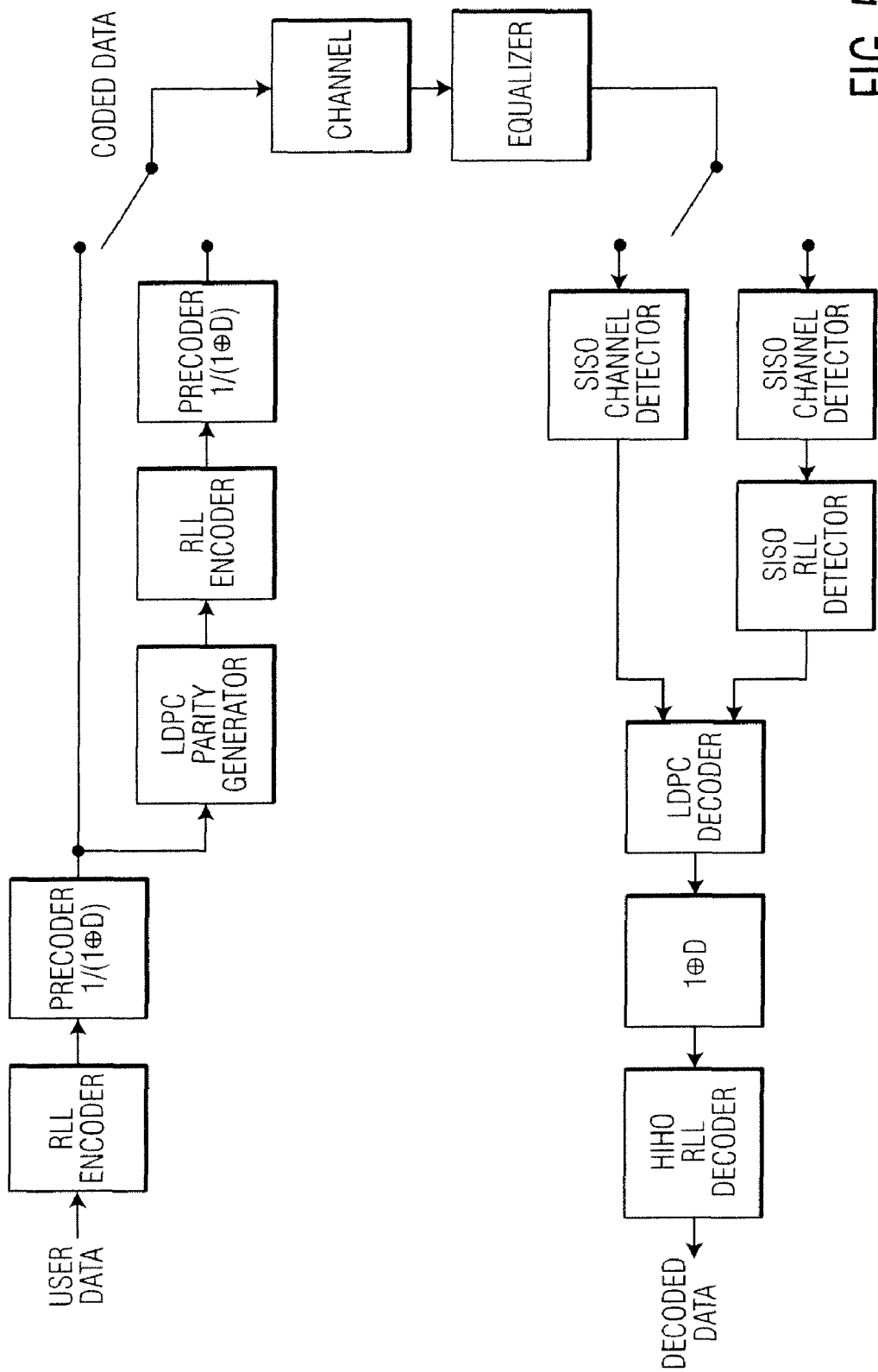
FIG. 5 shows the preferred configuration of the Bliss-scheme for soft-decision decoding in optical recording.

A more advantageous scheme for soft-decision decoding in optical recording is given by an adapted form of the Bliss-scheme. The original idea about such a basic scheme is disclosed by W. G. Bliss, *Circuitry for Performing Error Correction Calculations on Baseband Encoded Data to Eliminate Error Propagation*, in IBM Techn. Discl. Bul., Vol. 23, pp. 4633-4634, 1981. The adapted scheme is shown in FIG. 5. The transmitting part (upper part of FIG. 5) is explained first. User data are RLL encoded after which the differential code bitstream is fed through a 1T precoder generating a unipolar (or, equivalently, a bipolar) code bitstream. This represents the systematic part of the overall code bitstream that is entering the channel. With the unipolar code bitstream at its input, a systematic LDPC encoder generates parity bits, that are subsequently RLL encoded to generate a differential code bitstream for this parity-part, which is subsequently fed through a 1T precoder, after which the unipolar parity-part of the code bitstream is concatenated with the unipolar systematic-part of the code bitstream, and the overall unipolar code bitstream is entered as "coded data" into the channel (e.g. write-channel to write marks and non-marks on the information-carrying device, like an optical disc). Next, the receiving part (lower part of FIG. 5) is explained. Readout of the data written on the information carrying device by means of a read-out device produces a signal waveform, which is first equalized by an equalizer. The equalized signal waveform is the input of a Soft-In/Soft-Out (SISO) Channel detector, which produces soft-decision information in the form of log-likelihood ratios (LLRs) on the level of the unipolar code bitstream, both for the parity-part as well as the systematic-part of said unipolar code bitstream. For the parity-part, in addition a SISO RLL decoder is applied with as input the LLRs on the unipolar code bitstream and as output the LLRs on the level of the parity-bits of the LDPC-encoder. Both the LLRs of the unipolar code bitstream of the systematic-part as well as the LLRs of the parity-part after SISO-RLL decoding are the input for the LDPC decoder, which produces corrected versions of the unipolar code bitstream, which is subsequently fed through the inverse of the 1T-precoder, and finally through the hard-decision RLL-decoder, which has the decoded version of the user data as its output.

Generic Construction Method for any Combination of the d and r Constraint.

The basis of the new code is a new code construction method from which a code can be derived that is generic, in the sense that it can be applied to any combination of the d and r constraint. In the following paragraphs, this generic code-construction method is described.

The method relates to the conversion of a user bitstream into a coded bitstream (also known as channel bitstream) by means of an overall channel code. Such a channel code converts a group of M information bits into a group of N code word bits. The first group of bits is also commonly referred to as an information word, the second group of bits is known as a code word or channel word. The overall channel code may be realized through the concatenation of a number S of sub-codes in a well-defined order that is cyclically repeated with a predetermined repeat period: each of the sub-codes receives $m_i$-bit information words at its input, that are converted into $n_i$-bit code words, where $m_i$ and $n_i$ are integers characteristic for each of the considered sub-codes. Further, for each sub-code, the second characteristic integer number $n_i$ is greater than the first characteristic integer number $m_i$; also, the sum of the $m_i$-numbers of all sub-codes within the repeat period of the overall code equals M, and the sum of the $n_i$-numbers of all sub-codes within the repeat period of the overall code equals N. The key-feature in the new construction method is that, for each i-th sub-code, its $n_i$-bit code words are being divided into a number of T different types and are being arranged into T classes of coding states such that, for the given i-th sub-code, an $n_i$-bit code word of type t (where t is an integer number between 1 and T) can be concatenated with an $n_{i+1}$-bit code word of the next sub-code if this subsequent code word of the next sub-code belongs to one of coding states of the class with index T+1−t. For RLL code construction comprising the d and r constraints, it can be derived that $$T=1+(d+1)\times(r+1).$$

The latter statement will be first explained for the number of different code word types. A code-word type is defined in terms of the trailing bits of a code-word. Further, a code-word type with a low index puts less restrictions of the leading bits of the subsequent code-word than a code-word type with a high index. The code-word type nr. 1 allows concatenation with any subsequent code-word. Code-words belonging to code-word type 1 all end with d+1 zeroes, that is:

$$|\ldots 0^{d+1}| \quad nr. 1$$

Subsequently, code-words belonging to code-word type 2, 3, ..., r+2 all end with $10^d$. Note that this last run is a run with minimum run length (d+1 channel bits). Preceding this last run $10^d$, one can distinguish r+1 cases: code-word type 2 has a run larger than the minimum run length, code-word type 3 has exactly one minimum run length preceding the last run $10^d$, code-word type 4 has exactly two minimum run lengths preceding the last run $10^d$, ... and code-word type r+2 has exactly r minimum run lengths preceding the last run $10^d$. These r+1 different cases are listed below:

$$|\ldots 0^{d+1} \underline{10^d}| \quad nr. 2$$

$$|\ldots 0^{d+1} \overset{1\times}{\underline{10^d}} \underline{10^d}| \quad nr. 3$$

$$\ldots \ldots \ldots$$

$$|\ldots 0^{d+1} \overset{r\times}{\overline{\underline{10^d}\,\underline{10^d}\,\ldots\,\underline{10^d}}} \underline{10^d}| \quad nr. r+2$$

Next, code-words belonging to code-word type (r+2)+1, (r+2)+2, (r+2)+(r+1) all end with $10^{d-1}$. Note that this last run cannot be a complete run since its run length is exactly one bit shorter than the minimum run length (of length (d+1) channel bits). Preceding this last run $10^{d-1}$, one can distinguish r+1 cases: code-word type (r+2)+1 has a run larger than the minimum run length, code-word type (r+2)+2 has exactly one minimum run length preceding the last run $10^{d-1}$, code-word type (r+2)+3 has exactly two minimum run lengths preceding the last run $10^{d-1}$, ..., and code-word type (r+2)+(r+1) has exactly r minimum run lengths preceding the last run $10^{d-1}$. These r+1 different cases are listed below:

$$|\ldots 0^{d+1} \underline{10^{d-1}}| \quad nr. 1+(r+1)+1$$

$$|\ldots 0^{d+1} \overset{1\times}{\underline{10^d}} \underline{10^{d-1}}| \quad nr. 1+(r+1)+2$$

$$\ldots \ldots \ldots$$

$$|\ldots 0^{d+1} \overset{r\times}{\overline{\underline{10^d}\,\underline{10^d}\,\ldots\,\underline{10^d}}} \underline{10^{d-1}}| \quad nr. 1+(r+1)+r+1$$

This enumeration of different code-word types is continued along the same lines as above: each time, the number of channel bits in the start of the last run is reduced by exactly one channel bit. At a given stage, one arrives at the situation that the start of the last run comprises exactly two bits, given by 10. The number of different code-word types (r+1) are listed below:

$$|\ldots 0^{d+1} \underline{10}| \quad nr. 1+(d-1)\times(r+1)+1$$

-continued $$|\ldots 0^{d+1} \overset{1\times}{\underline{10^d}} \underline{10}| \quad nr. 1+(r-1)\times(r+1)+2$$

$$\ldots \ldots \ldots$$

$$|\ldots 0^{d+1} \overset{r\times}{\overline{\underline{10^d}\,\underline{10^d}\,\ldots\,\underline{10^d}}} \underline{10}| \quad nr. 1+(d-1)\times(r+1)+r+1$$

Finally, the last step in this enumeration of different code-word types is reached when one arrive at the situation that the start of the last run comprises exactly one bit given by 1. The number of different code-word types (r+1) are listed below:

$$|\ldots 0^{d+1} \underline{1}| \quad nr. 1+d\times(r+1)+1$$

$$|\ldots 0^{d+1} \overset{1\times}{\underline{10^d}} \underline{1}| \quad nr. 1+d\times(r+1)+2$$

$$\ldots \ldots \ldots$$

$$|\ldots 0^{d+1} \overset{r\times}{\overline{\underline{10^d}\,\underline{10^d}\,\ldots\,\underline{10^d}}} \underline{1}| \quad nr. 1+d\times(r+1)+r+1$$

In total, there are (d+1) enumeration steps (enumerating the different code-word types); for each enumeration step, there are r+1 different code-word types. In total, this amounts to the number of different code-word types given above, T=1+(d+1)×(r+1).

Before introducing the concept of a coding class, the leading bit-patterns are enumerated in a similar way as the code-word types (but with the respective leading bit-pattern obtained as the mirrored version from right to left of the trailing bit-pattern of the corresponding code-word type). This results in a catalogue of the possible leading bit-patterns:

$$|0^{d+1}\ldots \quad nr. 1$$

$$|\underline{0^d}1\,0^{d+1}\ldots \quad nr. 2$$

$$|\underline{0^d}1\,\underline{0^d}1\,0^{d+1}\ldots \quad nr. 3$$

$$\ldots$$

$$|\underline{0^d}1\,\underline{0^d}1\,\ldots\,\underline{0^d}1\,0^{d+1}\ldots \quad nr. r+2$$

$$|\underline{0^{d-1}}1\,0^{d+1}\ldots \quad nr. 1+(r+1)+1$$

$$|\underline{0^{d-1}}1\,\underline{0^d}1\,0^{d+1}\ldots \quad nr. 1+(r+1)+2$$

$$\ldots$$

$$|\underline{0^{d-1}}1\,\underline{0^d}1\,\ldots\,\underline{0^d}1\,0^{d+1}\ldots \quad nr. 1+(r+1)+(r+1)$$

$$\ldots$$

$$\ldots$$

$$|\underline{01}\,0^{d+1}\ldots \quad nr. 1+(d-1)\times(r+1)+1$$

$$|\underline{01}\,0^d 1\,0^{d+1}\ldots \quad nr. 1+(d-1)\times(r+1)+2$$

$$\ldots$$

$$|\underline{01}\,\underline{0^d}1\,\ldots\,\underline{0^d}1\,0^{d+1}\ldots \quad nr. 1+(d-1)\times(r+1)+(r+1)$$

$$|\underline{1}\,0^{d+1}\ldots \quad nr. 1+d\times(r+1)+1$$

$$|\underline{1}\,\underline{0^d}1\,0^{d+1}\ldots \quad nr. 1+d\times(r+1)+2$$

$$\ldots$$

$$|\underline{1}\,\underline{0^d}1\,\ldots\,\underline{0^d}1\,0^{d+1}\ldots \quad nr. 1+d\times(r+1)+(r+1)$$

An RLL channel code comprises a number of coding states. In the current invention, each coding state is at least a member of one coding class. A coding class with index t comprises all code-words that have a leading bit-pattern with index i such that $1 \leq i \leq t$. The structure of code-word types on the one hand, and coding classes on the other hand, leads to the following property, as is used in the new code construction method: a code-word belonging to code-word type t can only be followed by a code-word if that code-word belongs to one of the coding states of coding class $T+1-t$.

It is further convenient to note that, due to the structure of code-word types and coding states as outlined above, that each of the $p_i$ coding states of a given considered coding class i, is also a coding state of all coding classes that have an index larger than i.

For the case of d=1 and r=2, there are T=7 different coding classes and code word types. From the above, practical codes can be derived for a 9 bit oriented code, a byte oriented code and a code with a compact 4-to-6 mapping, all with d=1 and r=2.

For the case with d=2 and r=2, there are T=10 different coding classes and code word types.

RLL Codes with d=1 and RMTR-Constraint r=2 with a Compact 2-to-3 Mapping.

In relation to hard-decision bit-detection, d=1 RLL codes with an RMTR-constraint of r=2 can be created which have a very high efficiency for 9-bit user words at the input of the RLL encoder, or for 8-bit user words or bytes at the input of the RLL encoder. These codes have a large complexity in terms of number of coding states; further, they have at their input user words of length 8 or 9 bits. The latter two aspects make these highly efficient d=1 & r=2 RLL codes not suited for soft-decision RLL decoding, since, in order to limit the hardware complexity in such case, one can only allow a limited number of coding states and should have a concise code mapping from user bits onto channel bits. In the current invention a new code is generated, that has all properties as specified in the next section, and which make it much better suited for soft-decision SISO-RLL decoding. The current attempt involves the most compact mapping that is possible, that is, a code with a 2-to-3 mapping.

d=1 & r=2 RLL Codes Suitable for Soft-Decision RLL Decoding

The r=2 RLL constraint is advantageous for the performance of the channel detector (which can be a PRML bit-detector for hard-decision bit-detection, and a BCJR channel detector or Max-log-MAP channel detector for soft-decision bit-detection). For instance, for hard-decision bit-detection, the r=2 constraint yields a capacity gain of about 5% over the situation with $r \geq 6$. It is therefore the aim of the current invention to generate a d=1 RLL code with the following properties:

it has an RMTR-constraint r=2;
it has a limited number of coding states;
it must not have an extremely high efficiency, since opting for the latter may lead to a too large complexity of the code, which makes it unsuitable for soft-decision SISO-RLL decoding; so, a code rate R=⅔ is OK;
it has a concise mapping, e.g. 2-to-3, limiting the fan-out of branches from each of the coding states of the code to $2^2=4$;
in addition, it must preferably have a k-constraint as well.
it must have a high level of DC controllability.
it must have low error propagation.

All of the above properties have been realized with the code-construction as follows.

General Aspects

It is the purpose of the current code-design to have a channel code with a compact mapping of user bits onto channel bits, so that the hardware complexity of the soft-decision SISO-RLL decoder (in terms of the total number of branches) can be kept low. The new code has a mapping of 2-to-3 of user bits onto channel bits (thus a code rate R=⅔). As has been discussed before, the Shannon capacity of the combined RLL constraints d=1 and r=2 amounts to C(d=1,k=∞,r=2)= 0.679286. A code with mapping of user bits onto channel bits of 2-to-3 may be possible to construct, since it has a rate $$R=0.6667 \leq C(d=1,k=\infty,r=2).$$

Construction of a sliding-block runlength limited (RLL) code is related to the ACH-algorithm as disclosed by R. L. Adler, D. Coppersmith, and M. Hassner, in "Algorithms for Sliding Block Codes. An Application of Symbolic Dynamics to Information Theory", IEEE Transaction on Information Theory, Vol. IT-29, 1983, pp. 5-22. This algorithm looks for an approximate eigenvector, with $v_i$ denoting the i-th coefficient of the approximate eigenvector that satisfies the set of inequalities for all states i of the corresponding state-transition diagram (STD) that describes the RLL constraints (for a code with m-to-n mapping):

$$\Sigma_j D_{i,k}{}^n v_j \geq 2^m v_i. \qquad (89)$$

In the above equation, D represent the so-called adjacency-matrix or connection-matrix for the STD: its matrix elements are equal to one if the corresponding two STD-states are connected in the graph, and are equal to zero if they are not connected. For the new code with RLL constraints d=1 and r=2, the code has the parameters m=2 and n=3. This implies that the following inequalities have to be satisfied for the envisaged new code (with the numbers of states in the state-transition diagram describing the RLL constraints being equal to 7; see next subsection):

$$\sum_{j=1}^{7} D_{i,j}^3 v_j \geq 2^2 v_i, \; i = 1, 2, \ldots, 7. \qquad (90)$$

State-Transition Diagram (STD)

It should be noted that the state-transition diagram (STD) describes the basic runlength constraints that have to be satisfied by the channel bitstream. An RLL code that satisfies these runlength constraints is based on a finite-state machine (FSM) comprising a certain number of states. Along the branches of the FSM of the code, the code-words of the RLL code are shown. Consider the RLL-encoder to be in a given FSM-state; for each of the $2^m=4$ input words, there is a unique branch leaving said FSM-state. Each of the branches is uniquely characterized by a branch-label, which is the code-word, together with the "next state" which is the arrival state of said branch. Concatenation of the code-words according to the structure of the FSM leads to a channel bitstream that satisfies the runlength constraints as outlined in the STD.

Figure 1:
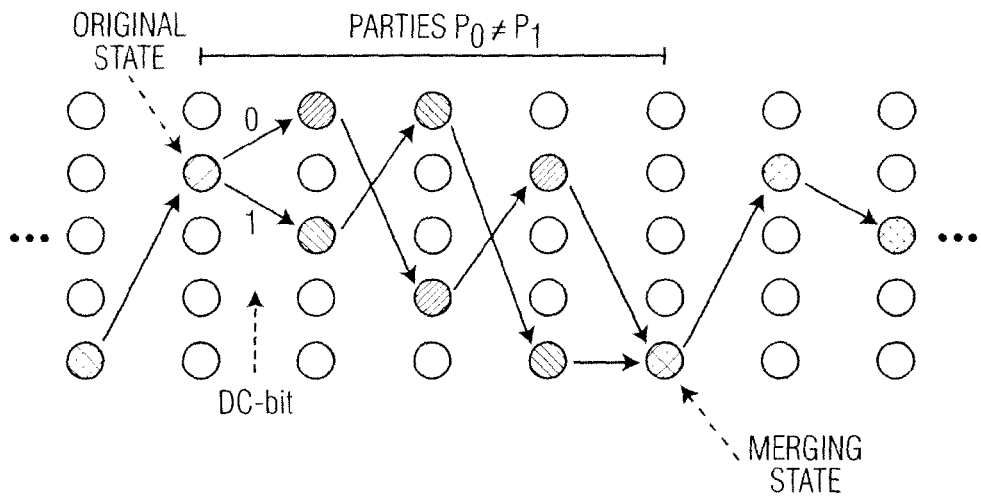
FIG. 1 illustrates the principle of parity-complementary word assignment.
Figure 2:
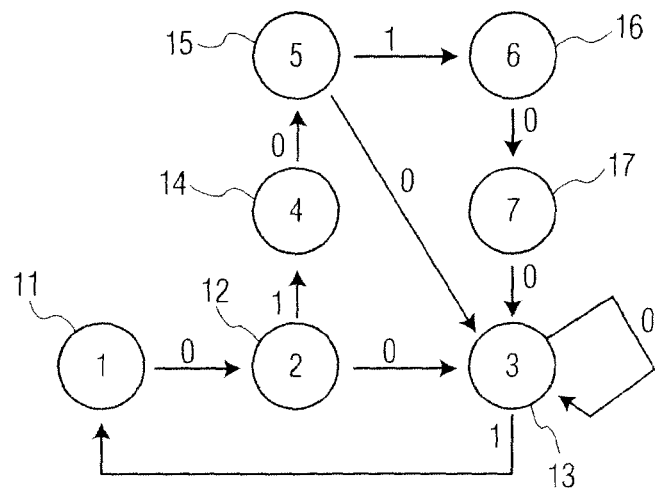
FIG. 2 shows the State Transition Diagram for d=1 and r=2 RLL constraints

For the RLL constraints d=1 and r=2, the STD is shown in FIG. 2: it comprises 7 states, denoted $\sigma_1, \sigma_2, \ldots, \sigma_7$. It should be noted that no k-constraint is considered in this STD.

Next, the fan-out of each STD-state is analyzed. The fan-out of a given STD-state is the collection of code words (of a given length) that can leave from that state. For STD-state $\sigma_i$, the fan-out is denoted $F_{\sigma_i}$. The leading bits of the channel words of the fan-out for the 7 STD-states are listed in Table 1. The characteristic bit-patterns in the code-words for the fan-out of a given STD-state comprises in some cases more than 3 channel bits; in such case, the fan-out of a given STD-state also limits the possibilities of the 3-bit code-word directly after the current 3-bit code-word that is emitted from the considered STD-state, and this because of the r=2 constraint. In Table 1, the renumbered STD-states are also listed, and which are denoted $\acute{\sigma}_i$. Finally, the different coding classes as will be introduced later on, are also listed in Table 1. For the sake of completeness, it should be noted that the word boundaries between consecutive 3-bit code-words are indicated by the vertical lines "|".

TABLE 1

Characteristics of Fan-Out for STD-states and Definition of Coding Classes. ("x" denotes a "don't care bit").

| Coding Class Nr | Original STD-state | Renumbered STD-state | Leading Bits of Fan-Out |
|---|---|---|---|
| 1 | $\sigma_6$ | $\acute{\sigma}_7$ | \|00x\|xxx\|xx . . . |
| 2 | $\sigma_4$ | $\acute{\sigma}_6$ | \|00x\|xxx\|xx . . . |
|   |   |   | \|010\|0xx\|xx . . . |
| 3 | $\sigma_1$ | $\acute{\sigma}_5$ | \|00x\|xxx\|xx . . . |
|   |   |   | \|010\|0xx\|xx . . . |
|   |   |   | \|010\|100\|xx . . . |
| 4 | $\sigma_7$ | $\acute{\sigma}_4$ | \|00x\|xxx\|xx . . . |
|   |   |   | \|010\|0xx\|xx . . . |
|   |   |   | \|010\|100\|xx . . . |
|   |   |   | \|010\|101\|00 . . . |
| 5 | $\sigma_5$ | $\acute{\sigma}_3$ | \|00x\|xxx\|xx . . . |
|   |   |   | \|010\|0xx\|xx . . . |
|   |   |   | \|010\|100\|xx . . . |
|   |   |   | \|010\|101\|00 . . . |
|   |   |   | \|100\|xxx\|xx . . . |
| 6 | $\sigma_2$ | $\acute{\sigma}_2$ | \|00x\|xxx\|xx . . . |
|   |   |   | \|010\|0xx\|xx . . . |
|   |   |   | \|010\|100\|xx . . . |
|   |   |   | \|010\|101\|00 . . . |
|   |   |   | \|100\|xxx\|xx . . . |
|   |   |   | \|101\|00x\|xx . . . |
| 7 | $\sigma_3$ | $\acute{\sigma}_1$ | \|00x\|xxx\|xx . . . |
|   |   |   | \|010\|0xx\|xx . . . |
|   |   |   | \|010\|100\|xx . . . |
|   |   |   | \|010\|101\|00 . . . |
|   |   |   | \|100\|xxx\|xx . . . |
|   |   |   | \|101\|00x\|xx . . . |
|   |   |   | \|101\|010\|0x . . . |

From Table 1, it is clear that the following hierarchy in fan-out applies (with STD-state $\sigma_3$ having the largest fan-out):

$$F_{\sigma_6} \subset F_{\sigma_4} \subset F_{\sigma_1} \subset F_{\sigma_7} \subset F_{\sigma_5} \subset F_{\sigma_2} \subset F_{\sigma_3}. \quad (91)$$

The new RLL code is constructed on the basis of a plurality of coding states. According to the present invention, these coding states are arranged into (a maximum of) seven classes ($T_{max}=1+(d+1)\times(r+1)$ which equals 7 for d=1 and r=2) as follows:

the n-bit code words of the 1st class of coding states belong to $F_{\sigma_6}$ (or $F_{\acute{\sigma}_7}$);

the n-bit code words of the 2nd class of coding states belong to $F_{\sigma_4}$ (or $F_{\acute{\sigma}_6}$);

the n-bit code words of the 3rd class of coding states belong to $F_{\sigma_1}$ (or $F_{\acute{\sigma}_5}$);

the n-bit code words of the 4th class of coding states belong to $F_{\sigma_7}$ (or $F_{\acute{\sigma}_4}$);

the n-bit code words of the 5th class of coding states belong to $F_{\sigma_5}$ (or $F_{\acute{\sigma}_3}$);

the n-bit code words of the 6th class of coding states belong to $F_{\sigma_2}$ (or $F_{\acute{\sigma}_2}$);

the n-bit code words of the 7th class of coding states belong to $F_{\sigma_3}$ (or $F_{\acute{\sigma}_1}$).

Due to this specific ordering of the coding classes according to the present invention, a coding state of a coding class i is also a coding state of all coding classes with index j not smaller than i, that is, j≧i. It is thus convenient to order the possible patterns of leading bits of code words as follows (where in some cases, it is also required to indicate the relevant bits of one or even two of the subsequent code-words):

TABLE 2

Ordering of Leading Bit Patterns. ("x" denotes a "don't care bit").

| i | Pattern |
|---|---|
| 1 | \|00x\|xxx\|xx . . . |
| 2 | \|010\|0xx\|xx . . . |
| 3 | \|010\|100\|xx . . . |
| 4 | \|010\|101\|00 . . . |
| 5 | \|100\|xxx\|xx . . . |
| 6 | \|101\|00x\|xx . . . |
| 7 | \|101\|010\|0x . . . |

In addition, it is for the code-construction according to the present invention beneficial to consider the following ordering of the trailing bit patterns (with the arrival state of the STD also indicated, both the original one and the renumbered one) as outlined in Table 3. According to the present invention, code words can be divided into 7 different types as specified by their trailing bit pattern. With the short code-word length of only 3 bits (for the 2-to-3 mapping), a code-word type will depend on the bits of the current code word, and also on some (if not all) bits of the previously emitted code-word.

TABLE 3

Ordering of Trailing Bit Patterns. Definition of Coding Types for 3-bit Code-Words. ("x" denotes a "don't care bit").

| Coding Type Nr (j) | Pattern Previous Word | Pattern Current Word | Original STD-state | Renumbered STD-state |
|---|---|---|---|---|
| 1 | \|xxx\| | \|x00\| | $\sigma_3$ | $\acute{\sigma}_1$ |
| 2 | \|xx0\| | \|010\| | $\sigma_2$ | $\acute{\sigma}_2$ |
| 3 | \|001\| | \|010\| | $\sigma_5$ | $\acute{\sigma}_3$ |
| 4 | \|101\| | \|010\| | $\sigma_7$ | $\acute{\sigma}_4$ |
| 5 | \|xxx\| | \|001\| | $\sigma_1$ | $\acute{\sigma}_5$ |
| 6 | \|x00\| | \|101\| | $\sigma_4$ | $\acute{\sigma}_6$ |
| 7 | \|010\| | \|101\| | $\sigma_6$ | $\acute{\sigma}_7$ |

It should be noted that the ordered trailing bit patterns (of Table 3) are the mirrored versions of the corresponding ordered leading bit patterns (of Table 2). Next, the already mentioned renumbering of the STD-states is discussed. It is now convenient to renumber the states of the STD in terms of the ordering of the trailing bit-patterns as they were listed in Table 3. This new numbering is outlined in the last two columns of Table 3. The new renumbered states are denoted $\acute{\sigma}_i$. With this new numbering, code words of type i will arrive in the (renumbered) STD-state with the same index, that is, $\acute{\sigma}_i$; consequently, a basic rule is that:

code words of type i can be concatenated with any code word that belongs to a coding state of class 8-i as a subsequent code word.

It is to be noted that code words belonging to a coding state of class 8-i have leading bit patterns (from Table 2) with index l where $1 \leq l \leq 8-i$. As an example, code words of type 3 (end with trailing bit pattern . . . 001010|) can be concatenated with code words from coding states of class 5, which implies that the latter code words may start with the leading bit patterns (Table 2) i=1, i=2, . . . , i=5. This division of code words into 7 different types of code words, and the arrangement of coding states into 7 different coding classes, forms the basis for the further code construction: in this way, the RLL constraints d=1 and r=2 always remain satisfied (also upon concatenation of code words). From Table 3, it is clear that the following hierarchy in fan-out applies for the renumbered STD-states:

$$F_{\sigma_7} \subset F_{\sigma_6} \subset F_{\sigma_5} \subset F_{\sigma_4} \subset F_{\sigma_3} \subset F_{\sigma_2} \subset F_{\sigma_1}. \quad (92)$$

The renumbered STD-state $\grave{\sigma}_1$ has the largest fan-out of all, and $\grave{\sigma}_7$ the smallest one, with an enumerative ranking according to the decreasing fan-out from $\grave{\sigma}_1$ to $\grave{\sigma}_7$. With the renumbered STD-states, and a correspondingly rearranged connection matrix, denoted $\grave{D}$, the approximate eigenvector inequalities (for the "new" eigenvectors $\tilde{v}$) are rewritten as:

$$\sum_{j=1}^{7} \grave{D}_{l,j}^3 \tilde{v}_j \geq 2^2 \tilde{v}_l, l = 1, 2, \ldots, 7. \quad (93)$$

The number of coding states per coding class is denoted by the vector p. Its relation to the approximate eigenvector $\tilde{v}$ is given by (for the i-th component, with $1 \leq i \leq 7$):

$$p_i = \tilde{v}_{8-i}. \quad (94)$$

Note that with this advantageous construction, the coding classes have a numbering system that is exactly complementary to the numbering system of the renumbered STD-states; this could already have been obvious from Table 1, where the renumbering of STD-states was mentioned, but not explained. Further, again due to the specific construction of the different coding classes, the following inequality holds:

$$p_1 \leq p_2 \leq p_3 \ldots \leq p_7. \quad (95)$$

The Concept of Trivial Coding Classes

In the above reasoning, it has been assumed that all STD-states are visited as arrival states when emitting code-words from the FSM-codes of the RLL encoder. This corresponds with the situation of an approximate eigenvector where all its components are non-zero. However, in a code-construction it is possible that some STD-states have a component of the approximate eigenvector that equals 0. Let us consider just for the sake of simplicity, the case where there is only one such STD-state, with index 8-j such that $\tilde{v}_{8-j}=0$ (the case with more than one such an STD-state is a trivial extension). The corresponding coding class has then index j, with $p_j=0$, that is, the coding class is empty, since it contains no coding states. Such an empty coding class is referred to as trivial coding class. Therefore, the actual number of non-trivial (non-empty) coding classes, denoted $N_{cc}$, must satisfy the relation $N_{cc} \leq T_{max} = 1+(d+1) \times (r+1)$. The hierarchy in the number of coding states for the different coding classes as outlined in Eq. (95), only applies for the non-trivial coding classes. This is explained for the practical example with d=1 and r=2 where coding class j is a trivial coding class ($p_j=0$). The hierarchy in the numbers $p_i$ of the non-trivial coding classes then reads as (for the general case with the maximum number of coding classes equal to $T_{max}=1+(d+1) \times (r+1)$):

$$p_1 \leq p_2 \leq \ldots \leq p_{j-1} \leq p_{j+1} \leq \ldots \leq p_{T_{max}}.$$

Practical Design Choices.

Application of the above code-construction for a code with 2-to-3 mapping reveals that at minimum 5-fold state splitting is required, with 4 possible approximate eigenvectors given by $v=\{3,5,5,2,4,2,v_7\}$, $0 \leq v_7 \leq 3$.

As a convenient approximate eigenvector, one can chose $v=\{3,5,5,2,4,2,0\}$, or, $\tilde{v}=\{5,5,4,0,3,2,2\}$. For the numbers $p_j$, which is the number of coding states in a coding class, one gets p=\{2,2,3,0,4,5,5\}. There is one trivial empty coding class, that is, the one with index j=4. So, the number of non-trivial coding classes, denoted T or $N_{cc}$, equals 6. Denoting the coding classes by $CC_i$, the following distribution of coding states over the coding classes results:

TABLE 4

Coding States for Coding Classes in 2-to-3 d = 1 and r = 2 RLL Code.

| Coding Class | Coding States |
|---|---|
| $CC_1$ | $\Sigma_1, \Sigma_2$ |
| $CC_2$ | $\Sigma_1, \Sigma_2$ |
| $CC_3$ | $\Sigma_1, \Sigma_2, \Sigma_3$ |
| $CC_4$ | none (trivial CC). |
| $CC_5$ | $\Sigma_1, \Sigma_2, \Sigma_3, \Sigma_4$ |
| $CC_6$ | $\Sigma_1, \Sigma_2, \Sigma_3, \Sigma_4, \Sigma_5$ |
| $CC_7$ | $\Sigma_1, \Sigma_2, \Sigma_3, \Sigma_4, \Sigma_5$ |

Following is a Listing of Code-Words as they can be used in Each of the Coding Classes Coding Class $CC_1$

| Code-Word | "Next-States" | nr of entries |
|---|---|---|
| \|000\| | $\Sigma_1, \Sigma_2, \Sigma_3, \Sigma_4, \Sigma_5$ | 5 |
| \|001\| | $\Sigma_1, \Sigma_2, \Sigma_3$ | 3 |
| | Total: | 8 |
| | | fits exactly for first 2 states $\Sigma_1$ and $\Sigma_2$. |

For the ease of notation states of the finite state machine of the code are denoted by S1 . . . S5 corresponding to the states $\Sigma_1 \ldots \Sigma_5$ as used in the tables. For the first two states, S1 and S2, there are thus exactly 8 channel words available, given by 000 (next-states S1-S5) and 001 (next-states S1-S3). It is now considered how many ways of allocating words to states are possible, while discarding the number of possible permutations of words within a given state. There are $$\binom{8}{4} = 70$$

possible allocations of 4 channel words out of the above 8 words to state S1, and, consequently, allocating the remaining 4 channel words to state S2. After this allocation of channel words to states S1 and S2, there are no words left over for use in a subsequent state of a subsequent coding class.

Coding Class $CC_2$

Since this coding class has the same states as the previous coding class, there is nothing in addition as compared to coding class $CC_1$.

Coding Class $CC_3$

| Code-Word | "Next-States" | nr of entries |
|---|---|---|
| \|010\| | $\Sigma_1, \Sigma_2, \Sigma_3, \Sigma_4$ | 4 |
| | Total: | 4 fits exactly for 1 extra state $\Sigma_3$. |

For state S3, there are thus exactly 4 channel words, so only one way of allocating these words to state S3 is possible.

Coding Class $CC_4$

Not applicable since trivial coding state.

Coding Class $CC_5$

| Code-Word | "Next-States" | nr of entries |
|---|---|---|
| \|010\| | $\Sigma_5$ | 1 |
| \|100\| | $\Sigma_1, \Sigma_2, \Sigma_3, \Sigma_4, \Sigma_5$ | 5 |
| | Total: | 6 2 left after use of 4 for 1 extra state $\Sigma_4$. |

For state S4, there are thus 6 possible channel words. Consequently, there are $$\binom{6}{4} = 15$$

possible allocations of 4 channel words out of the above 6 words to state S4, and, consequently, the remaining 2 channel words for each of these allocations is reserved for further use in state S5.

Coding Class $CC_6$

| Code-Word | "Next-States" | nr of entries |
|---|---|---|
| \|101\| | $\Sigma_1, \Sigma_2$ | 2 |
| | Total: | 2 with 2 left from $CC_4$ fits exactly for 1 extra state $\Sigma_5$. |

Together with the two words that are left over upon allocation of channel words to state S4, there are exactly 4 channel words for state S5.

Coding Class $CC_7$

Since this coding class has the same states as the previous coding class, there is nothing in addition as compared to coding class $CC_6$.

Possible Allocations and Code Groups

The total number of possible allocations of channel words to states amounts to 70×15=1050. It should be noted that an allocation of channel words to states is not yet a valid code. Upon further evaluation, there are 14 of these allocations that really lead to codes. It should be noted that in each of these remaining allocations, which will be referred to as code groups, there are still 24 permutations possible of the words within a given code table. Since there are 5 states in the FSM of the code, and since no code-words (bit-triplet+next-state) are in common between different states, this yields a total of $24^5 = 7962624$ possible codes in each of these 14 code groups. One code for each of these 14 possible code groups are shown in the following table and referenced CodeTable-d1kinfr2Nr01.txt through CodeTabled1kinfr2Nr14.txt.

For each entry in each table, we have listed first the user symbol (0 for user-dibit 00, 1 for user-dibit 01, 2 for user-dibit 10 and 3 for user-dibit 11), then the three-bit triplet followed by the next state of the channel word.

| StateS01 | | | StateS02 | | | StateS03 | | | StateS04 | | | StateS05 | | |
|---|---|---|---|---|---|---|---|---|---|---|---|---|---|---|
| CodeTabled1kinfr2Nr01.txt | | | | | | | | | | | | | | |
| 0 | 000 | 5 | 0 | 000 | 1 | 0 | 010 | 1 | 0 | 100 | 3 | 0 | 100 | 1 |
| 1 | 001 | 1 | 1 | 000 | 2 | 1 | 010 | 2 | 1 | 100 | 4 | 1 | 100 | 2 |
| 2 | 001 | 2 | 2 | 000 | 3 | 2 | 010 | 3 | 2 | 100 | 5 | 2 | 101 | 1 |
| 3 | 001 | 3 | 3 | 000 | 4 | 3 | 010 | 4 | 3 | 010 | 5 | 3 | 101 | 2 |
| CodeTabled1kinfr2Nr02.txt | | | | | | | | | | | | | | |
| 0 | 000 | 4 | 0 | 000 | 1 | 0 | 010 | 1 | 0 | 100 | 3 | 0 | 100 | 1 |
| 1 | 001 | 1 | 1 | 000 | 2 | 1 | 010 | 2 | 1 | 100 | 4 | 1 | 100 | 2 |
| 2 | 001 | 2 | 2 | 000 | 3 | 2 | 010 | 3 | 2 | 100 | 5 | 2 | 101 | 1 |
| 3 | 001 | 3 | 3 | 000 | 5 | 3 | 010 | 4 | 3 | 010 | 5 | 3 | 101 | 2 |
| CodeTabled1kinfr2Nr03.txt | | | | | | | | | | | | | | |
| 0 | 000 | 4 | 0 | 000 | 1 | 0 | 010 | 1 | 0 | 100 | 3 | 0 | 100 | 1 |
| 1 | 000 | 5 | 1 | 000 | 2 | 1 | 010 | 2 | 1 | 100 | 4 | 1 | 100 | 2 |
| 2 | 001 | 1 | 2 | 000 | 3 | 2 | 010 | 3 | 2 | 100 | 5 | 2 | 101 | 1 |
| 3 | 001 | 2 | 3 | 001 | 3 | 3 | 010 | 4 | 3 | 010 | 5 | 3 | 101 | 2 |
| CodeTabled1kinfr2Nr04.txt | | | | | | | | | | | | | | |
| 0 | 000 | 3 | 0 | 000 | 1 | 0 | 010 | 1 | 0 | 100 | 3 | 0 | 100 | 1 |
| 1 | 001 | 1 | 1 | 000 | 2 | 1 | 010 | 2 | 1 | 100 | 4 | 1 | 100 | 2 |
| 2 | 001 | 2 | 2 | 000 | 4 | 2 | 010 | 3 | 2 | 100 | 5 | 2 | 101 | 1 |
| 3 | 001 | 3 | 3 | 000 | 5 | 3 | 010 | 4 | 3 | 010 | 5 | 3 | 101 | 2 |

-continued

| | StateS01 | | | StateS02 | | | StateS03 | | | StateS04 | | | StateS05 | | |
|---|---|---|---|---|---|---|---|---|---|---|---|---|---|---|---|
| | | | | | | CodeTable d1kinfr2Nr05.txt | | | | | | | | | |
| 0 | 000 | 3 | 0 | 000 | 1 | 0 | 010 | 1 | 0 | 100 | 3 | 0 | 100 | 1 | |
| 1 | 000 | 5 | 1 | 000 | 2 | 1 | 010 | 2 | 1 | 100 | 4 | 1 | 100 | 2 | |
| 2 | 001 | 1 | 2 | 000 | 4 | 2 | 010 | 3 | 2 | 100 | 5 | 2 | 101 | 1 | |
| 3 | 001 | 2 | 3 | 001 | 3 | 3 | 010 | 4 | 3 | 010 | 5 | 3 | 101 | 2 | |
| | | | | | | CodeTable d1kinfr2Nr06.txt | | | | | | | | | |
| 0 | 000 | 3 | 0 | 000 | 1 | 0 | 010 | 1 | 0 | 100 | 3 | 0 | 100 | 1 | |
| 1 | 000 | 4 | 1 | 000 | 2 | 1 | 010 | 2 | 1 | 100 | 4 | 1 | 100 | 2 | |
| 2 | 001 | 1 | 2 | 000 | 5 | 2 | 010 | 3 | 2 | 100 | 5 | 2 | 101 | 1 | |
| 3 | 001 | 2 | 3 | 001 | 3 | 3 | 010 | 4 | 3 | 010 | 5 | 3 | 101 | 2 | |
| | | | | | | CodeTable d1kinfr2Nr07.txt | | | | | | | | | |
| 0 | 000 | 3 | 0 | 000 | 1 | 0 | 010 | 1 | 0 | 100 | 3 | 0 | 100 | 1 | |
| 1 | 000 | 4 | 1 | 000 | 2 | 1 | 010 | 2 | 1 | 100 | 4 | 1 | 100 | 2 | |
| 2 | 000 | 5 | 2 | 001 | 1 | 2 | 010 | 3 | 2 | 100 | 5 | 2 | 101 | 1 | |
| 3 | 001 | 3 | 3 | 001 | 2 | 3 | 010 | 4 | 3 | 010 | 5 | 3 | 101 | 2 | |
| | | | | | | CodeTable d1kinfr2Nr08.txt | | | | | | | | | |
| 0 | 000 | 1 | 0 | 000 | 3 | 0 | 010 | 1 | 0 | 100 | 3 | 0 | 100 | 1 | |
| 1 | 000 | 2 | 1 | 000 | 4 | 1 | 010 | 2 | 1 | 100 | 4 | 1 | 100 | 2 | |
| 2 | 001 | 1 | 2 | 000 | 5 | 2 | 010 | 3 | 2 | 100 | 5 | 2 | 101 | 1 | |
| 3 | 001 | 2 | 3 | 001 | 3 | 3 | 010 | 4 | 3 | 010 | 5 | 3 | 101 | 2 | |
| | | | | | | CodeTable d1kinfr2Nr09.txt | | | | | | | | | |
| 0 | 000 | 1 | 0 | 000 | 3 | 0 | 010 | 1 | 0 | 100 | 3 | 0 | 100 | 1 | |
| 1 | 000 | 2 | 1 | 000 | 4 | 1 | 010 | 2 | 1 | 100 | 4 | 1 | 100 | 2 | |
| 2 | 000 | 5 | 2 | 001 | 1 | 2 | 010 | 3 | 2 | 100 | 5 | 2 | 101 | 1 | |
| 3 | 001 | 3 | 3 | 001 | 2 | 3 | 010 | 4 | 3 | 010 | 5 | 3 | 101 | 2 | |
| | | | | | | CodeTable d1kinfr2Nr10.txt | | | | | | | | | |
| 0 | 000 | 1 | 0 | 000 | 3 | 0 | 010 | 1 | 0 | 100 | 3 | 0 | 100 | 1 | |
| 1 | 000 | 2 | 1 | 000 | 5 | 1 | 010 | 2 | 1 | 100 | 4 | 1 | 100 | 2 | |
| 2 | 000 | 4 | 2 | 001 | 1 | 2 | 010 | 3 | 2 | 100 | 5 | 2 | 101 | 1 | |
| 3 | 001 | 3 | 3 | 001 | 2 | 3 | 010 | 4 | 3 | 010 | 5 | 3 | 101 | 2 | |
| | | | | | | CodeTable d1kinfr2Nr11.txt | | | | | | | | | |
| 0 | 000 | 1 | 0 | 000 | 3 | 0 | 010 | 1 | 0 | 100 | 3 | 0 | 100 | 1 | |
| 1 | 000 | 2 | 1 | 001 | 1 | 1 | 010 | 2 | 1 | 100 | 4 | 1 | 100 | 2 | |
| 2 | 000 | 4 | 2 | 001 | 2 | 2 | 010 | 3 | 2 | 100 | 5 | 2 | 101 | 1 | |
| 3 | 000 | 5 | 3 | 001 | 3 | 3 | 010 | 4 | 3 | 010 | 5 | 3 | 101 | 2 | |
| | | | | | | CodeTable d1kinfr2Nr12.txt | | | | | | | | | |
| 0 | 000 | 1 | 0 | 000 | 4 | 0 | 010 | 1 | 0 | 100 | 3 | 0 | 100 | 1 | |
| 1 | 000 | 2 | 1 | 000 | 5 | 1 | 010 | 2 | 1 | 100 | 4 | 1 | 100 | 2 | |
| 2 | 000 | 3 | 2 | 001 | 1 | 2 | 010 | 3 | 2 | 100 | 5 | 2 | 101 | 1 | |
| 3 | 001 | 3 | 3 | 001 | 2 | 3 | 010 | 4 | 3 | 010 | 5 | 3 | 101 | 2 | |
| | | | | | | CodeTable d1kinfr2Nr13.txt | | | | | | | | | |
| 0 | 000 | 1 | 0 | 000 | 4 | 0 | 010 | 1 | 0 | 100 | 3 | 0 | 100 | 1 | |
| 1 | 000 | 2 | 1 | 001 | 1 | 1 | 010 | 2 | 1 | 100 | 4 | 1 | 100 | 2 | |
| 2 | 000 | 3 | 2 | 001 | 2 | 2 | 010 | 3 | 2 | 100 | 5 | 2 | 101 | 1 | |
| 3 | 000 | 5 | 3 | 001 | 3 | 3 | 010 | 4 | 3 | 010 | 5 | 3 | 101 | 2 | |
| | | | | | | CodeTable d1kinfr2Nr14.txt | | | | | | | | | |
| 0 | 000 | 1 | 0 | 000 | 5 | 0 | 010 | 1 | 0 | 100 | 3 | 0 | 100 | 1 | |
| 1 | 000 | 2 | 1 | 001 | 1 | 1 | 010 | 2 | 1 | 100 | 4 | 1 | 100 | 2 | |
| 2 | 000 | 3 | 2 | 001 | 2 | 2 | 010 | 3 | 2 | 100 | 5 | 2 | 101 | 1 | |
| 3 | 000 | 4 | 3 | 001 | 3 | 3 | 010 | 4 | 3 | 010 | 5 | 3 | 101 | 2 | |

It should be noted that these 14 code groups as listed above only differ with respect to the allocation of words in states S1 and S2. Moreover, careful inspection reveals that code groups i and 15-i (i=1, ..., 8) are equivalent since they can be transformed one into the other by a simple interchange of states S1 and S2. So, finally, there are only 7 essentially different code groups.

Codes with PCWA Mappings

Next, for each of the above 7 code groups, out of all $24^5 = 7962624$ code-mappings, only the PCWA code-mappings are retained, leaving only two code groups, nrs. 8 and 14 (or, equivalently, nrs. 1 and 7) as possible sources for candidate codes. Subsequently, PCWA-mappings are searched for that maximize the PCWA-related probability $p_C$ of merging of the alternative coding paths for the two possible values of the DC-control bit. Without loss of generality, the first bit of a user-dibit is chosen as the DC-control bit. For coding paths of L=5 channel words, the maximized probability amounts to $p_C(L=5)=0.9804$.

Eight Essentially Different Codes

With these PCWA-based criteria, there are 16 codes for each of both coding groups nrs. 8 and 14 possible, out of which again only 4 out of 16 are really independent (since the other codes for each group can be derived simply by bit-flipping of the first bit of a user-dibit, or by flipping of the second bit of a user-dibit, or by flipping of both bits of a user-dibit). For the sake of simple notation, these 8 essentially different codes are denoted 08-01, 08-02, 08-03 and 08-04 for code group nr. 8, and 14-01, 14-02, 14-03 and 14-04 for code group nr. 14.

Example of PCWA-Mapping on Code 14-02

It is recalled that an RLL code with a parity-complementary word assignment (PCWA) has the property that the respective channel bit sequences that are encoded from the same message-bit sequence (starting from any possible state of the FSM of the code) for each of the two values of a DC-control bit (that is part of a given user word) have opposite parities for the sequences generated from the starting state up to the state where both encoder paths merge. For the case that the encoder paths do not merge, there is no such constraint. As an example for the code 14-02, the user bit sequence c0 00 11 . . . is taken to be encoded from state S4, with c the DC-control bit in the first di-bit. For c=0, the encoding path equals:

$$\xrightarrow{xyz} S4 \xrightarrow{100} S3 \xrightarrow{010} S3 \xrightarrow{010} S2 \xrightarrow{uvw}$$

For c=1, the encoding path is different for 3 channel words, after which both paths merge in state S2:

$$\xrightarrow{xyz} S4 \xrightarrow{010} S5 \xrightarrow{100} S1 \xrightarrow{000} S2 \xrightarrow{uvw}$$

The encoded sequences have respective parities (odd and even) that are indeed opposite. The probability of merging for the alternative coding paths for the two possible values of the DC-control bit correlates with the level of DC-control performance. For a coding path with a length of 5 bit-triplets, it can be evaluated that for the code of Table 5 a high merging probability is obtained given by $p_C(L=5)=0.9804$.

k-Constraint Via Substitutions on The Level of the Channel Bitstream

For the above 5-state FSM a k constraint is realized via a number of substitutions (also called "detours" since they represent actually a detour from the standard encoding paths through the code trellis) that become effective as soon as too many zeroes would occur. These substitutions require a characteristic pattern that does not occur upon standard use of the FSM of the code. Such a pattern is given by the two consecutive bit-triplets 101 010. It should be noted that word 101 is only used in state S5, with possible next-states S1 and S2, from which words are leaving that always start with at least two zeroes. In view of the r=2 constraint, the two bits preceding the 6-bit characteristic pattern and the one bit after it have all to be equal to zero. These channel substitutions can have the same or opposite parity compared to the all-zero sequences they substitute. The same parity is realized by substituting in the following way (where the *-bit can be either 0 or 1):

*00 000 000 000 (original)

=>

*00 101 010 010 (substituted)

which involves 4 consecutive triplets. In case of the opposite parity between original and substituting sequences, a lower k-constraint can be realized, that is, k=10, via substitutions that involve 3 consecutive bit-triplets in the following way:

*00 000 000 (original)

=>

*00 101 010 (substituted)

It should be noted that, since the bit patterns of the original and substituted sequences have opposite parities, the application of the substitution at the location of the DC-control bit may locally frustrate DC-controllability.

For a code (out of the set of 8 essentially different codes) with k=10 constraint, there are 8 substitutions, 4 leaving from state S1 and another 4 leaving from state S5. Code 14-02 is in terms of bit-error rate performance the best code out of these 8 codes. Its code-table is given by table 5:

TABLE 5

|       | S1     | S2     | S3     | S4     | S5     |
|-------|--------|--------|--------|--------|--------|
| 00 (0) | 000 S3 | 001 S1 | 010 S3 | 100 S3 | 100 S1 |
| 01 (1) | 000 S4 | 001 S2 | 010 S4 | 100 S4 | 100 S2 |
| 10 (2) | 000 S1 | 001 S3 | 010 S1 | 010 S5 | 101 S1 |
| 11 (3) | 000 S2 | 000 S5 | 010 S2 | 100 S5 | 101 S2 | and the 8 substitutions are:

TABLE 6

| Departure State | Sequence of User-Symbols | Channel-Bit Sequence without/with Detour | Arrival State |
|---|---|---|---|
| S1 | 10 10 10 (**)   | 000 000 000 => 000 101 010 | S1 |
| S1 | 10 10 11 (**)   | 000 000 000 => 000 101 010 | S2 |
| S1 | 10 10 00 (**)   | 000 000 000 => 000 101 010 | S3 |
| S1 | 10 10 01 (10)   | 000 000 000 => 000 101 010 | S4 |
| S5 | 00 10 10 (**)   | 100 000 000 => 100 101 010 | S1 |
| S5 | 00 10 11 (**)   | 100 000 000 => 100 101 010 | S2 |
| S5 | 00 10 00 (**)   | 100 000 000 => 100 101 010 | S3 |
| S5 | 00 10 01 (10)   | 100 000 000 => 100 101 010 | S4 |

Note that for 2 of these substitutions in table 6, also the 4th symbol value is required (with user-bits denoted between brackets); for all other 6 substitutions, the bits of the 4th symbol value are denoted (**) which implies that they are "don't care bits". Similarly, the substitutions (or detours) for all other 7 codes can be derived as well, and this type of information is gathered together in the following 8 code tables that are inclusive of the substitutions. It should be noted that in the tables below, the user symbols instead of the user di-bits are given (the 4th user symbol is indicated between brackets only there where it matters). Further, it should be noted that DC-control is done via inserted DC-control bits, inserted into the message bitstream, and these DC-control bits are located as the first bit in a user di-bit.

Code Table Group-08 PCWA-Code Nr. 08-01

| StateS01 | | | StateS02 | | | StateS03 | | | StateS04 | | | StateS05 | | |
|---|---|---|---|---|---|---|---|---|---|---|---|---|---|---|
| 0 | 001 | 1 | 0 | 000 | 3 | 0 | 010 | 3 | 0 | 100 | 3 | 0 | 100 | 1 |
| 1 | 001 | 2 | 1 | 000 | 4 | 1 | 010 | 4 | 1 | 100 | 4 | 1 | 100 | 2 |
| 2 | 000 | 1 | 2 | 000 | 5 | 2 | 010 | 1 | 2 | 100 | 5 | 2 | 101 | 1 |
| 3 | 000 | 2 | 3 | 001 | 3 | 3 | 010 | 2 | 3 | 010 | 5 | 3 | 101 | 2 |

Actual-Detours

| nr | StartingState | Symbol-Pattern | ArrivalState |
|---|---|---|---|
| 1 | 1 | 222 | 1 |
| 2 | 1 | 223 | 2 |
| 3 | 1 | 230 | 3 |
| 4 | 1 | 231 (3) | 4 |
| 5 | 5 | 022 | 1 |
| 6 | 5 | 023 | 2 |
| 7 | 5 | 030 | 3 |
| 8 | 5 | 031 (3) | 4 |

Code Table Group-08 PCWA-Code Nr. 08-02

| StateS01 | | | StateS02 | | | StateS03 | | | StateS04 | | | StateS05 | | |
|---|---|---|---|---|---|---|---|---|---|---|---|---|---|---|
| 0 | 001 | 1 | 0 | 000 | 3 | 0 | 010 | 3 | 0 | 100 | 3 | 0 | 100 | 1 |
| 1 | 001 | 2 | 1 | 000 | 4 | 1 | 010 | 4 | 1 | 100 | 4 | 1 | 100 | 2 |
| 2 | 000 | 1 | 2 | 000 | 5 | 2 | 010 | 1 | 2 | 010 | 5 | 2 | 101 | 1 |
| 3 | 000 | 2 | 3 | 001 | 3 | 3 | 010 | 2 | 3 | 100 | 5 | 3 | 101 | 2 |

Actual-Detours

| nr | StartingState | Symbol-Pattern | ArrivalState |
|---|---|---|---|
| 1 | 1 | 222 | 1 |
| 2 | 1 | 223 | 2 |
| 3 | 1 | 230 | 3 |
| 4 | 1 | 231 (2) | 4 |
| 5 | 5 | 022 | 1 |
| 6 | 5 | 023 | 2 |
| 7 | 5 | 030 | 3 |
| 8 | 5 | 031 (2) | 4 |

Code Table Group-08 PCWA-Code Nr. 08-03

| StateS01 | | | StateS02 | | | StateS03 | | | StateS04 | | | StateS05 | | |
|---|---|---|---|---|---|---|---|---|---|---|---|---|---|---|
| 0 | 001 | 2 | 0 | 000 | 4 | 0 | 010 | 4 | 0 | 100 | 4 | 0 | 100 | 2 |
| 0 | 001 | 2 | 0 | 000 | 4 | 0 | 010 | 4 | 0 | 100 | 4 | 0 | 100 | 2 |
| 1 | 000 | 1 | 1 | 000 | 5 | 1 | 010 | 1 | 1 | 100 | 5 | 1 | 101 | 1 |
| 2 | 000 | 2 | 2 | 001 | 3 | 2 | 010 | 2 | 2 | 010 | 5 | 2 | 101 | 2 |
| 3 | 001 | 1 | 3 | 000 | 3 | 3 | 010 | 3 | 3 | 100 | 3 | 3 | 100 | 1 |

Actual-Detours

| nr | StartingState | Symbol-Pattern | ArrivalState |
|---|---|---|---|
| 1 | 1 | 111 | 1 |
| 2 | 1 | 112 | 2 |
| 3 | 1 | 123 | 3 |
| 4 | 1 | 120 (2) | 4 |
| 5 | 5 | 311 | 1 |
| 6 | 5 | 312 | 2 |
| 7 | 5 | 323 | 3 |
| 8 | 5 | 320 (2) | 4 |

Code Table Group-08 PCWA-Code Nr. 08-04

| StateS01 | | | StateS02 | | | StateS03 | | | StateS04 | | | StateS05 | | |
|---|---|---|---|---|---|---|---|---|---|---|---|---|---|---|
| 0 | 001 | 2 | 0 | 000 | 4 | 0 | 010 | 4 | 0 | 100 | 4 | 0 | 100 | 2 |
| 1 | 000 | 1 | 1 | 000 | 5 | 1 | 010 | 1 | 1 | 010 | 5 | 1 | 101 | 1 |
| 2 | 000 | 2 | 2 | 001 | 3 | 2 | 010 | 2 | 2 | 100 | 5 | 2 | 101 | 2 |
| 3 | 001 | 1 | 3 | 000 | 3 | 3 | 010 | 3 | 3 | 100 | 3 | 3 | 100 | 1 |

-continued

Actual-Detours

| nr | StartingState | Symbol-Pattern | ArrivalState |
|----|---------------|----------------|--------------|
| 1  | 1 | 111     | 1 |
| 2  | 1 | 112     | 2 |
| 3  | 1 | 123     | 3 |
| 4  | 1 | 120 (1) | 4 |
| 5  | 5 | 311     | 1 |
| 6  | 5 | 312     | 2 |
| 7  | 5 | 323     | 3 |
| 8  | 5 | 320 (1) | 4 |

Code Table Group-14 PCWA-Code Nr. 14-01

| StateS01 | | | StateS02 | | | StateS03 | | | StateS04 | | | StateS05 | | |
|---|---|---|---|---|---|---|---|---|---|---|---|---|---|---|
| 0 | 000 | 3 | 0 | 001 | 1 | 0 | 010 | 3 | 0 | 100 | 3 | 0 | 100 | 1 |
| 1 | 000 | 4 | 1 | 001 | 2 | 1 | 010 | 4 | 1 | 100 | 4 | 1 | 100 | 2 |
| 2 | 000 | 1 | 2 | 001 | 3 | 2 | 010 | 1 | 2 | 100 | 5 | 2 | 101 | 1 |
| 3 | 000 | 2 | 3 | 000 | 5 | 3 | 010 | 2 | 3 | 010 | 5 | 3 | 101 | 2 |

Actual-Detours

| nr | StartingState | Symbol-Pattern | ArrivalState |
|----|---------------|----------------|--------------|
| 1 | 1 | 222     | 1 |
| 2 | 1 | 223     | 2 |
| 3 | 1 | 220     | 3 |
| 4 | 1 | 221 (3) | 4 |
| 5 | 5 | 022     | 1 |
| 6 | 5 | 023     | 2 |
| 7 | 5 | 020     | 3 |
| 8 | 5 | 021 (3) | 4 |

Code Table Group-14 PCWA-Code Nr. 14-02

| StateS01 | | | StateS02 | | | StateS03 | | | StateS04 | | | StateS05 | | |
|---|---|---|---|---|---|---|---|---|---|---|---|---|---|---|
| 0 | 000 | 3 | 0 | 001 | 1 | 0 | 010 | 3 | 0 | 100 | 3 | 0 | 100 | 1 |
| 1 | 000 | 4 | 1 | 001 | 2 | 1 | 010 | 4 | 1 | 100 | 4 | 1 | 100 | 2 |
| 2 | 000 | 1 | 2 | 001 | 3 | 2 | 010 | 1 | 2 | 010 | 5 | 2 | 101 | 1 |
| 3 | 000 | 2 | 3 | 000 | 5 | 3 | 010 | 2 | 3 | 100 | 5 | 3 | 101 | 2 |

Actual-Detours

| nr | StartingState | Symbol-Pattern | ArrivalState |
|----|---------------|----------------|--------------|
| 1 | 1 | 222     | 1 |
| 2 | 1 | 223     | 2 |
| 3 | 1 | 220     | 3 |
| 4 | 1 | 221 (2) | 4 |
| 5 | 5 | 022     | 1 |
| 6 | 5 | 023     | 2 |
| 7 | 5 | 020     | 3 |
| 8 | 5 | 021 (2) | 4 |

Code Table Group-14 PCWA-Code Nr. 14-03

| StateS01 | | | StateS02 | | | StateS03 | | | StateS04 | | | StateS05 | | |
|---|---|---|---|---|---|---|---|---|---|---|---|---|---|---|
| 0 | 000 | 4 | 0 | 001 | 2 | 0 | 010 | 4 | 0 | 100 | 4 | 0 | 100 | 2 |
| 1 | 000 | 1 | 1 | 001 | 3 | 1 | 010 | 1 | 1 | 100 | 5 | 1 | 101 | 1 |
| 2 | 000 | 2 | 2 | 000 | 5 | 2 | 010 | 2 | 2 | 010 | 5 | 2 | 101 | 2 |
| 3 | 000 | 3 | 3 | 001 | 1 | 3 | 010 | 3 | 3 | 100 | 3 | 3 | 100 | 1 |

Actual-Detours

| nr | StartingState | Symbol-Pattern | ArrivalState |
|----|---------------|----------------|--------------|
| 1 | 1 | 111     | 1 |
| 2 | 1 | 112     | 2 |
| 3 | 1 | 113     | 3 |
| 4 | 1 | 110 (2) | 4 |
| 5 | 5 | 311     | 1 |
| 6 | 5 | 312     | 2 |
| 7 | 5 | 313     | 3 |
| 8 | 5 | 310 (2) | 4 |

-continued

Code Table Group-14 PCWA-Code Nr. 14-04

| StateS01 | | | StateS02 | | | StateS03 | | | StateS04 | | | StateS05 | | |
|---|---|---|---|---|---|---|---|---|---|---|---|---|---|---|
| 0 | 000 | 4 | 0 | 001 | 2 | 0 | 010 | 4 | 0 | 100 | 4 | 0 | 100 | 2 |
| 1 | 000 | 1 | 1 | 001 | 3 | 1 | 010 | 1 | 1 | 010 | 5 | 1 | 101 | 1 |
| 2 | 000 | 2 | 2 | 000 | 5 | 2 | 010 | 2 | 2 | 100 | 5 | 2 | 101 | 2 |
| 3 | 000 | 3 | 3 | 001 | 1 | 3 | 010 | 3 | 3 | 100 | 3 | 3 | 100 | 1 |

Actual-Detours

| nr | StartingState | Symbol-Pattern | ArrivalState |
|---|---|---|---|
| 1 | 1 | 111 | 1 |
| 2 | 1 | 112 | 2 |
| 3 | 1 | 113 | 3 |
| 4 | 1 | 110 (1) | 4 |
| 5 | 5 | 311 | 1 |
| 6 | 5 | 312 | 2 |
| 7 | 5 | 313 | 3 |
| 8 | 5 | 310 (1) | 4 |

Hard-Decision RLL Decoding

For the above codes 08-01 through 08-04 and 14-01 through 14-04, inclusive of the substitutions for the k-constraint, hard-decision RLL-decoding can be done in two ways:

(i) performing first the backward substitution via

*00 101 010 (substituted)

=>

Figure 4:
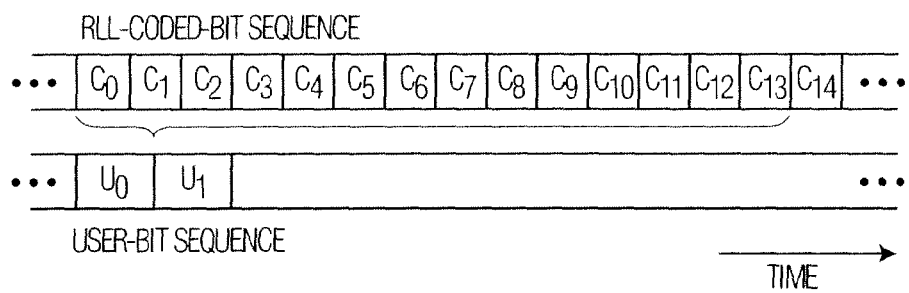
FIG. 4 shows the sliding-block decoder for one of the selected codes (code 14-02) together with the associated boolean logic.

*00 000 000 (original)

subsequently followed by the sliding-block decoder for the code without k-constraint (as derived from the basic 5-state FSM of the code), or:

(ii) integrating both above operations (back-ward substitution+RLL-sliding block decoding) into one single adapted sliding-block decoder; for the above codes the decoder's sliding block length was 5. For code 14-02, the integrated sliding-block decoder together with the boolean logic is shown in FIG. 4.

The invention claimed is:

1. A method of converting a user bitstream into a coded bitstream by means of an overall channel code comprising the steps of
converting M-bit information words into N-bit code words,
realizing said overall channel code by concatenating a number S of sub-codes in a cyclically repeated order with a predetermined repeat period, wherein each of the sub-codes receives $m_i$-bit information words, where $m_i$ is an integer characteristic for each of the sub-codes, that are converted into $n_i$-bit code words, where $n_i$ is an integer characteristic for each of the sub-codes, and where for each sub-code, said characteristic integer number $n_i$ is greater than said characteristic integer number $m_i$, such that the sum of the $m_i$-numbers of all sub-codes within said repeat period equals M, and that the sum of the $n_i$-numbers of all sub-codes within said repeat period equals N, and:
dividing for each sub-code, its $n_i$-bit code words into a number of $T_{max}$ different code-word types and arranging its $n_i$-bit code words into $T_{max}$ coding classes of coding states such that, for a given sub-code, an $n_i$-bit code word of type t, where t is an integer number between 1 and $T_{max}$, can be concatenated into a concatenated set of code words, realizing said N-bit code-words of said overall channel code that generates said coded bitstream, with an $n_{i+1}$-bit code word of the next sub-code if said subsequent code word of said next sub-code belongs to one of coding states of the coding class with index $T_{max}+1-t$, and:
generating an output information sequence comprising the steps of:
generating a first output information sequence by inserting a first DC control bit into an input information sequence at predetermined intervals,
generating a second output information sequence by inserting a second DC control bit different from the first DC control bit into the input information sequence at said predetermined intervals, the step of generating an output information sequence being followed by:
a first code converting step realized by said overall channel code, comprising:
generating a first provisional code sequence by performing a code conversion of said first output information sequence generated by an information sequence generating means according to said overall code,
generating a second provisional code sequence by performing a code conversion of said second output information sequence generated by the information sequence generating means according to said overall code,
characterized in that the step of generating a first provisional code sequence and the step of generating a second provisional code sequence apply a coding rule by which, when representing the coding rule by a finite-state code conversion table, code words are assigned to information words so that a two's complement of a sum of coding bits included in the first provisional code sequence, is always different from a further two's complement of a sum of coding bits included in the second provisional code sequence, when a first code state of the first provisional code sequence encoded starting from a predetermined original state is identical to a second code state of the second provisional code sequence encoded starting from said predetermined original state, and that the step of generating a first provisional code sequence and the step of generating a second provisional code sequence are followed by:

selecting either the first provisional code sequence generated by a code converting means or the second provisional code sequence generated by the code converting means depending on a value of at least one parameter that correlates with a DC content of the coded bit stream.

2. A method as claimed in claim 1, where the code-word type is determined by a number of trailing bits of said codeword.

3. A method as claimed in claim 2, wherein the concatenated set of N-bit code words realizing said coded bitstream satisfy a dkr-constraint, where d refers to a minimum number of zero-bits between two consecutive one-bits in the coded bitstream, and k refers to a maximum number of zero-bits between two consecutive one-bits in the coded bitstream, and where r indicates a maximum number of consecutive minimum runs of d zero-bits each preceded by a one-bit.

4. A method as claimed in claim 3, where the number of different code-word types T and non-empty coding classes, wherein a non-empty coding class is defined to have at least one coding state, is not larger than $T_{max}=1+(d+1)\times(r+1)$.

5. A method as claimed in claim 4, where d=1 and r=2, and $T_{max}$ equals 7.

6. A method as claimed in claim 5, where $T=T_{max}=7$ and where the number of sub-codes S equals 1.

7. A method as claimed in claim 6, where the single sub-code has a mapping with m=2 and n=3.

8. A method as claimed in claim 3, where the number of different code-word types T and the number of different non-empty coding classes T, where T equals $T_{max}=1+(d+1)\times(r+1)$.

9. A method as claimed in claim 4, where, for each of the sub-codes, each of said $T \leq T_{max}$ non-empty coding classes of coding states comprises $p_1, p_2, \ldots, p_{max}$ coding states, wherein the trivial empty coding classes are omitted, such that for the numbers representing the non-zero number of states of the non-empty coding classes $p_1 \leq p_2 < \ldots < p_{max}$, and with $p_{max}$ giving the total number of coding states for said considered sub-code, further characterized in that each of the $p_i$ coding states of a given considered class "i", is also a coding state of all classes that have an index larger than "i".

10. A method as claimed in claim 9, where a number of non-trivial coding classes T equals 6, with coding class number 4 being the empty one, yielding $p_4=0$, and where the number $p_1, p_2, p_3, p_5, p_6, p_7$ of coding states for each of the non-trivial coding classes T of coding states amounts to $p_1=2$, $p_2=2$, $p_3=3$, $p_5=4$, $p_6=5$ and $p_7=5$.

11. A method as claimed in claim 10, where a finite k-constraint is realized through an extra coding shell with substitutions on the coded bitstream added to a Finite-State Machine with a basic 2-to-3 mapping of the code.

12. A method as claimed in claim 11, where such substitutions that comprise an alternative code word sequence replacing an original code word sequence have a parity or two's complement of the sum of coding bits that is identical to a parity or two's complement of the sum of coding bits of the original code word sequence.

13. A method as claimed in claim 11, where such substitutions that comprise an alternative code word sequence replacing an original code word sequence, have a parity or two's complement of the sum of coding bits that is opposite to a parity or two's complement of the sum of coding bits of the original code word sequence.

14. A method as claimed in claim 13, where a k=10 constraint is realized through the extra coding shell with substitutions on the coded bitstream.

15. A method as claimed in claim 14, where the substitutions in the extra coding shell are given by:

| Departure State | Sequence of User-Symbols | Channel-Bit Sequence without/with Detour | Arrival State |
| --- | --- | --- | --- |
| S1 | 10 10 10 (**) | 000 000 000 => 000 101 010 | S1 |
| S1 | 10 10 11 (**) | 000 000 000 => 000 101 010 | S2 |
| S1 | 10 10 00 (**) | 000 000 000 => 000 101 010 | S3 |
| S1 | 10 10 01 (10) | 000 000 000 => 000 101 010 | S4 |
| S5 | 00 10 10 (**) | 100 000 000 => 100 101 010 | S1 |
| S5 | 00 10 11 (**) | 100 000 000 => 100 101 010 | S2 |
| S5 | 00 10 00 (**) | 100 000 000 => 100 101 010 | S3 |
| S5 | 00 10 01 (10) | 100 000 000 => 100 101 010 | S4. |

16. A method of converting a coded bitstream as converted using a code as obtained by the method of claim 15 into a user bitstream comprising the step of applying a sliding block decoder, where a boolean expression for the sliding-block decoder of the code inclusive of the extra coding $$u_0 = \overline{c_0 c_2 c_3 c_4} + c_2 c_4 + c_3 \overline{c_6 c_7} + c_0 c_2 + \overline{c_0 c_2} c_5 + c_3 c_8 c_{10}$$

$$u_1 = c_6 \overline{c_9 c_{10}} = \overline{c_3} c_5 + c_6 c_{11} c_{13} + c_3 c_6 \overline{c_8} + \overline{c_1} c_3 \overline{c_7} + c_3 \overline{c_5} c_7$$

shell with the channel substitutions is given by.

17. A method as claimed in claim 10, where a single sub-code is used and where a code-table of the single sub-code is given by

|  | S1 | S2 | S3 | S4 | S5 |
| --- | --- | --- | --- | --- | --- |
| 00 (0) | 000 S3 | 001 S1 | 010 S3 | 100 S3 | 100 S1 |
| 01 (1) | 000 S4 | 001 S2 | 010 S4 | 100 S4 | 100 S2 |
| 10 (2) | 000 S1 | 001 S3 | 010 S1 | 010 S5 | 101 S1 |
| 11 (3) | 000 S2 | 000 S5 | 010 S2 | 100 S5 | 101 S2. |

18. A method as claimed in claim 5, where for each sub-code trailing bits are specified for the different code word types by the following set of rules, that is, the n-bit code words of the 1st type end with
"00",
the n-bit code words of the 2nd type cud with
"0010",
the n-bit code words of the 3rd type end with
"001010",
the n-bit code words of the 4th type end with
"00101010",
the n-bit code words of the 5th type end with
"001",
the n-bit code words of the 6th type end with
"00101",
the n-bit code words of the 7th type end with "0010101",
and where leading bits of the code words belonging to the different coding classes are determined by the following set of rules, that is,
the n-bit code words of a coding state of the 1st class start with
"00",
the n-bit code words of a coding state of the 2nd class start with
"00" or "0100",
the n-bit code words of a coding state of the 3rd class start with
"00", "0100" or "010100",
the n-bit code words of a coding state of the 4th class start with
"00", "0100", "010100" or "01010100", the n-bit code words of a coding state of the 5th class start with
"00", "0100", "010100", "01010100" or "100",
the n-bit code words of a coding state of the 6th class start with
"00", "0100", "010100", "01010100", "100" or "10100",
the n-bit code words of a coding state of the 7th class start with
"00", "0100", "010100", "01010100", "100", "10100" or "1010100".

19. A method as claimed in claim 1, where the code-word type is determined by all bits of said code-word, together with at least one bit of a preceding code-word.

20. A record carrier comprising a signal comprising a coded bit stream that is coded using a method as claimed in claim 1.

21. A coder for converting a user bitstream into a coded bitstream by means of an overall channel code by converting M-bit information words into N-bit code words,
the coder comprising sub-coders repeated in a cyclical order with a predetermined repeat period, each sub-coder using a sub-code, wherein each sub-coder is arranged to receive $m_i$-bit information words, where $m_i$ is an integer characteristic for each of the sub-codes, and is arranged to convert the received $m_i$-bit information words into $n_i$-bit code words, where $n_i$ is an integer characteristic for each of the sub-codes, and where for each sub-code, said characteristic integer number $n_i$ is greater than said characteristic integer number $m_i$, such that the sum of the $m_i$-numbers of all sub-codes within said repeat period equals M, and that the sum of the $n_i$-numbers of all sub-codes within said repeat period equals N, where for each sub-code, its $n_i$-bit code words are divided into a number of $T_{max}$ different code-word types and arranging its $n_i$-bit code words into $T_{max}$ coding classes of coding states such that, for a given sub-code, an $n_i$-bit code word of type t, where t is an integer number between 1 and $T_{max}$, can be concatenated into a concatenated set of code words thus generating said coded bitstream and realizing said. N-bit code-words of said overall channel code, with an $n_{t+1}$-bit code word of the next sub-code if said subsequent code word of said next sub-code belongs to one of coding states of the coding class with index $T_{max}+1-t$, and:
comprising output information sequence generating means for generation of a first output information sequence by inserting a first DC control bit into an input information sequence at predetermined intervals, and for generation of a second output information sequence by inserting a second DC control bit different from the first DC control bit into the input information sequence at said predetermined intervals, and:
further comprising a first code converting means realized by said overall channel code, for generating a first provisional code sequence by making a code conversion of said first output information sequence generated by the information sequence generating means according to said overall code with its sub-codes, together with a second code converting means realized by said overall channel code, for generating a second provisional code sequence by making a code conversion of said second output information sequence generated by the information sequence generating means according to said overall code with its sub-codes, further:
characterized in that the first and second code converting means use a coding rule by which, in case the coding rule is represented by a finite-state code conversion, table, code words are assigned to information words so that a two's complement of a sum of coding bits included in the first provisional code sequence, is always different from a two's complement of a further sum of coding bits included in the second provisional code sequence, on condition that a first code state of the first provisional code sequence encoded starting from a predetermined original state is identical to a second code state of the second provisional code sequence encoded starting from said predetermined original state, and further:
comprising a selecting means for selecting either the first provisional code sequence generated by the first code converting means or the second provisional code sequence generated by the second code converting means depending on a value of at least one parameter that correlates with a DC content of the coded bit stream.

22. A coder as claimed in claim 21, where the code-word type is determined by a number of trailing bits of said code-word.

23. A coder claimed in claim 22, wherein the concatenated set of N-bit code words realizing said coded bitstream satisfy a dkr-constraint, where d refers to a minimum number of zero-bits between two consecutive one-bits in the coded bit-stream, and k refers to a maximum number of zero-bits between two consecutive one-bits in the coded bitstream, and where r indicates a maximum number of consecutive minimum runs of d zero-bits each preceded by a one-bit.

24. A coder as claimed in claim 23, where the number of different code-word types T and non-empty coding classes, wherein a non-empty coding class is defined to have at least one coding state, is not larger than $T_{max}=1+(d+1)\times(r+1)$.

25. A coder as claimed in claim 24, where d=1 and r=2, and $T_{max}$ equals 7.

26. A coder as claimed in claim 25, where $T=T_{max}=7$ and where the number of sub-coders S equals 1.

27. A coder as claimed in claim 26, where the single sub-coder uses a mapping with m=2 and n=3.

28. A coder as claimed in claim 23, where the number, of different code-word types T and the number of different non-empty coding classes T, where T equals $T_{max}=1+(d+1)\times(r+1)$.

29. A coder as claimed in claim 24, where, for each of the sub-coders, each of said $T \leq T_{max}$ non-empty coding classes of coding states comprises $p_1, p_2, \ldots, p_{max}$ coding states, wherein the trivial empty coding classes are omitted, such that for the numbers representing the non-zero number of states of the non-empty coding classes $p_1 \leq p_2 \leq \ldots \leq p_{max}$, and with $p_{max}$ giving the total number of coding states for said considered sub-coder, further characterized in that each of the $p_i$ coding states of a given considered class "i", is also a coding state of all classes that have an index larger than "i".

30. A coder as claimed in claim 25, where for each sub-coder trailing bits are specified for the different code word types by the following set of rules, that is,
the n-bit code words of the 1st type end with "00",
the n-bit code words of the 2nd type end with "0010",
the n-bit code words of the 3rd type end with "001010",
the n-bit code words of the 4th type end with "00101010",
the n-bit code words of the 5th type end with "001",
the n-bit code words of the 6th type end with "00101",
the n code words of the 7th type end with "0010101", and where leading bits of the code words belonging to the different coding classes are determined by the following set of rules, that is, the n-bit code words of a coding state of the 1st class start with
"00",
the n-bit code words of a coding state of the 2nd class start with
"00" or "0100",
the n-bit code words of a coding state of the 3rd class start with
"00", "0100" or "010100",
the n-bit code words of a coding state of the 4th class start with
"00", "0100", "010100" or "01010100",
the n-bit code words of a coding state of the 5th class start with
"00", "0100", "010100", "01010100" or "100",
the n-bit code words of a coding state of the 6th class start with
"00", "0100", "010100", "01010100", "100" or "10100",
the n-bit code words of a coding state of the 7th class start with
"00", "0100", "010100", "01010100", "100", "10100" or "1010100".

31. A coder as claimed in claim 30, where a number of non-trivial coding classes T equals 6, with coding class number 4 being the empty one, yielding $p_4=0$, and where the number $p_1,p_2,p_3,p_5,p_5,p_6,p_7$ of coding states for each of the non-trivial coding classes T of coding states amounts to $p_1=2$, $p_2=2$, $p_3=3$, $p_5=4$, $p_6=5$ and $p_7=5$.

32. A coder as claimed in claim 31, where the sub-coder comprises a Finite-State Machine with a basic 2-to-3 mapping of the code and where a finite k-constraint is realized through an extra coding shell on top of the Finite-State Machine.

33. A coder as claimed in claim 32, comprising means for realising a finite k-constraint through an extra coding shell with substitutions on the coded bitstream added to a Finite-State Machine with a (basic) 2-to-3 mapping of the code.

34. A coder as claimed in claim 33, where such substitutions comprise an alternative code word sequence replacing an original code word sequence have a parity or two's complement of the sum of coding bits that is identical to a parity or two's complement of the sum of coding bits of the original code word sequence.

35. A coder as claimed in claim 33, where such substitutions comprise an alternative code word sequence replacing an original code word sequence have a parity or two's complement of the sum of coding bits that is opposite to the parity or two's complement of the sum of coding bits of the original code word sequence.

36. A coder as claimed in claim 32, where the coder comprises a single sub-coder for using a single sub-code and where a code-table of the single sub-code is given by

|        | S1     | S2     | S3     | S4     | S5     |
|--------|--------|--------|--------|--------|--------|
| 00 (0) | 000 S3 | 001 S1 | 010 S3 | 100 S3 | 100 S1 |
| 01 (1) | 000 S4 | 001 S2 | 010 S4 | 100 S4 | 100 S2 |
| 10 (2) | 000 S1 | 001 S3 | 010 S1 | 010 S5 | 101 S1 |
| 11 (3) | 000 S2 | 000 S5 | 010 S2 | 100 S5 | 101 S2.|

37. A coder as claimed in claim 34, where the finite k-constraint has a k=10 constraint.

38. A coder as claimed in claim 37, where the substitutions in the extra coding shell are given by:

| Departure State | Sequence of User-Symbols | Channel-Bit Sequence without/with Detour | Arrival State |
|---|---|---|---|
| S1 | 10 10 10 (**) | 000 000 000 => 000 101 010 | S1 |
| S1 | 10 10 11 (**) | 000 000 000 => 000 101 010 | S2 |
| S1 | 10 10 00 (**) | 000 000 000 => 000 101 010 | S3 |
| S1 | 10 10 01 (10) | 000 000 000 => 000 101 010 | S4 |
| S5 | 00 10 10 (**) | 100 000 000 => 100 101 010 | S1 |
| S5 | 00 10 11 (**) | 100 000 000 => 100 101 010 | S2 |
| S5 | 00 10 00 (**) | 100 000 000 => 100 101 010 | S3 |
| S5 | 00 10 01 (10) | 100 000 000 => 100 101 010 | S4. |

39. A coder as claimed in claim 21, where the code-word type is determined by all bits of said code-word, together with at least one bit of a preceding code-word.

40. Recorder comprising a coder as claimed in claim 21.

* * * * *